US008067684B2

(12) United States Patent
Kaneko

(10) Patent No.: US 8,067,684 B2
(45) Date of Patent: Nov. 29, 2011

(54) FILTER DEVICE AND ELECTRONIC MUSICAL INSTRUMENT USING THE FILTER DEVICE

(75) Inventor: Yoji Kaneko, Akishima (JP)

(73) Assignee: Casio Computer Co., Ltd., Tokyo (JP)

( * ) Notice: Subject to any disclaimer, the term of this patent is extended or adjusted under 35 U.S.C. 154(b) by 134 days.

(21) Appl. No.: 12/571,181

(22) Filed: Sep. 30, 2009

(65) Prior Publication Data

US 2010/0077910 A1 Apr. 1, 2010

Related U.S. Application Data

(62) Division of application No. 11/901,472, filed on Sep. 17, 2007, now Pat. No. 7,622,665.

(30) Foreign Application Priority Data

Sep. 19, 2006 (JP) ................................ 2006-252184
Sep. 19, 2006 (JP) ................................ 2006-252185
Oct. 27, 2006 (JP) ................................ 2006-292200

(51) Int. Cl.
*G10H 1/12* (2006.01)
*H03H 7/01* (2006.01)

(52) U.S. Cl. ................ 84/661; 84/622; 84/626; 84/659; 84/662

(58) Field of Classification Search ........................ None
See application file for complete search history.

(56) References Cited

U.S. PATENT DOCUMENTS 5,270,954 A 12/1993 Sakata
5,450,350 A 9/1995 Sakata
5,502,277 A 3/1996 Sakata
5,744,742 A * 4/1998 Lindemann et al. ............ 84/623
6,002,080 A 12/1999 Tanaka
6,673,995 B2 1/2004 Ogawa et al.
7,622,665 B2 * 11/2009 Kaneko ........................... 84/661
2006/0130637 A1 6/2006 Crebouw (Continued)

FOREIGN PATENT DOCUMENTS

EP 0 360 306 A1 3/1990

(Continued)

OTHER PUBLICATIONS

Japanese Office Action dated Jul. 20, 2010 and English translation thereof, in counterpart Japanese Application No. 2006-252184.

(Continued)

*Primary Examiner* — Marlo Fletcher
(74) *Attorney, Agent, or Firm* — Holtz, Holtz, Goodman & Chick, PC

(57) ABSTRACT

In a filter device, a filter coefficient calculation circuit has a parameter table. The parameter table stores a plurality of sets of filter coefficients associated with a first parameter based on a frequency and a second parameter based on respective plurality of levels representing a degree of attenuation or enhancement of a gain of a filter in filter characteristics. The filter coefficient calculation circuit extracts a set of filter coefficients from a parameter table with the use of the first parameter and the second parameter determined according to a frequency and a strength of a musical sound signal, and outputs the extracted set of filter coefficients to the filter. The filter circuit performs filter processing for the musical sound signal, based on the filter characteristics determined by the set of filter coefficients.

16 Claims, 32 Drawing Sheets

U.S. PATENT DOCUMENTS

2008/0066612 A1* 3/2008 Kaneko .......................... 84/661

FOREIGN PATENT DOCUMENTS

| | | | |
|---|---|---|---|
| JP | 63-239494 | A | 10/1988 |
| JP | 4-78213 | A | 3/1992 |
| JP | 08-234759 | A | 9/1996 |

OTHER PUBLICATIONS

Extended European Search Report (EESR) dated Mar. 15, 2011, in counterpart European Application No. 07018319.9.

Chinese Office Action dated Dec. 27, 2010 (and English translation thereof) in counterpart Chinese Application No. 200710153359.2.

* cited by examiner

Freq=1946Hz

FIG. 26

401

| KEY RANGE | KEY NAME | ORIGINAL WAVEORM DATA |
|---|---|---|
| 1 | A0~B0 | A#0 |
| ⋮ | ⋮ | ⋮ |
| i | F4~A4 | G4 |
| i+1 | A#4~D5 | C5 |
| ⋮ | ⋮ | ⋮ |
| N | A#7~C8 | B7 |

FILTER DEVICE AND ELECTRONIC MUSICAL INSTRUMENT USING THE FILTER DEVICE

CROSS-REFERENCE TO RELATED APPLICATIONS

The present application is a Divisional Application of U.S. application Ser. No. 11/901,472 filed Sep. 17, 2007 now U.S. Pat. No. 7,622,665, which is based upon and claims the benefit of priority from the prior Japanese Patent Applications No. 2006-252184, filed Sep. 19, 2006; No. 2006-252185, filed Sep. 19, 2006; and No. 2006-292200, filed Oct. 27, 2006, the entire contents of which are incorporated herein by reference.

BACKGROUND OF THE INVENTION

1. Field of the Invention

The present invention relates to a filter device and an electronic musical instrument equipped with the filter device.

2. Description of the Related Art

Tone color of an acoustic musical instrument is changed according to change of the amplitude ratio of a harmonic tone in relation to a fundamental tone. In particular, when tone color is changed according to strong and weak of performance, as a musical instrument is performed strongly (for example, a piano key is touched strongly), the amplitude ratio of a high order harmonic tone becomes higher. Meanwhile, as the musical instrument is performed weakly (for example, the piano key is touched weakly), the amplitude ratio of the high order harmonic tone becomes smaller.

FIG. 12A and FIG. 12B are graphs showing waveforms of an acoustic piano. FIG. 12A shows a waveform when the piano key is touched fortissimo, and FIG. 12B shows a waveform when the piano key is touched mezzo piano. FIG. 13A and FIG. 13B are graphs showing spectrums calculated based on the respective waveforms of FIG. 12A and FIG. 12B. In FIG. 13A and FIG. 13B, the horizontal axis (frequency axis) is linear, and the vertical axis is shown in units of dB. The spectrums of FIG. 13A and FIG. 13B are calculated based on the processing that sample 4096 is cut out from the section in the vicinity of sounding start of the waveforms shown in FIG. 12A and FIG. 12B, with the use of Blackmann's window function.

FIG. 14 is a diagram showing spectrum envelopes extracted from the spectrums shown in FIG. 13A and FIG. 13B. As shown in FIG. 14, the spectrum envelopes have approximately constant slopes from the fundamental wave to the higher harmonic wave, and the slopes are uniformly changed according to strength of the performance. In the example of FIG. 14, as the strength of the performance becomes stronger, the slopes become larger (that is, approaches 0). Therefore, when color tones are changed by a filter circuit in an electronic musical instrument, the filter circuit desirably has the filter characteristics with the spectrum envelopes as shown in FIG. 14.

The existing filter transfer function is shown in the following Formula 1.

Formula 1

$$H(z) = \frac{w_0^2}{1 + (-2 + w_0^2 + w_0 Q)z^{-1} + (1 - w_0 Q)z^{-2}} \quad (1)$$

where $\omega_0 = 2\pi fc/fs$ ($0<\omega_0<1$)

where fc represents a cutoff frequency, fs represents a sampling frequency, $\omega_0$ represents a cutoff angle frequency, and Q represents selectivity.

In the existing filter circuit, the filter characteristics are changed according to $\omega_0$ (or fc) and Q. Therefore, the filter circuit uses $\omega_0$ (or fc) and Q as parameters, and the characteristics are changed based on these parameters.

FIG. 15 is a graph showing filter characteristics when fc as a parameter is changed in a secondary IIR filter having the characteristics shown in Formula 1. In FIG. 15, the horizontal axis (frequency axis) is linear (0 to 10 kHz), and the vertical axis is shown in units of dB. As shown in FIG. 15, even when fc is changed, the changed filter characteristics are far from the characteristics as shown in FIG. 13A, FIG. 13B, and FIG. 14. Therefore, in the electronic musical instrument, there has been a problem that it is extremely difficult to realize tone color change equal to the tone color change of the acoustic piano by controlling the cutoff frequency.

Further, currently, many electronic musical instruments employ the PCM method. In the PCM method, an attack-time waveform when musical sound is generated (attack time) and waveform data of the subsequent repetition waveform are stored in the waveform memory. On and after the attack time, the waveform data of the repetition waveform is repeatedly read, and thereby the capacity of the waveform memory is decreased. However, when only the same waveform is repeated, the color tones are fixed and monotonized. Therefore, the tone colors are changed as time goes on by the filter circuit. In particular, in an acoustic piano, the higher order harmonic tone is more fastly attenuated as time goes on. It has not been possible to realize such a change by the existing filter circuit.

For example, in Japanese Laid-Open (Kokai) Patent Publication No. 4-78213, a filter using a specific frequency f0 in which the transfer characteristics start to change and the change ratio thereof as a parameter instead of the cutoff frequency fc is suggested. However, even when the filter disclosed in the foregoing patent document is used, it has been particularly difficult to realize change equal to the tone color change of an acoustic piano. In particular, there has been the following problem. That is, the frequency in which the maximum attenuation level or the maximum enhancement level of a given frequency is changed to a given ratio thereof (hereinafter referred to as "turnover frequency" in the specification) is moved according to change of the parameter.

SUMMARY OF THE INVENTION

In view of the existing problems, it is an object of the present invention to provide a filter device capable of realizing tone color change equal to tone color change of an acoustic musical instrument, in particular an acoustic piano, and an electronic musical instrument.

In accordance with an aspect of the present invention, there is provided a filter device comprising: a filter coefficient outputting means for outputting a set of filter coefficients; and a filter means for providing filter processing based on filter characteristics determined by the set of filter coefficients outputted from the filter coefficient outputting means for a musical sound signal having a given frequency supplied from the outside; wherein the filter coefficient outputting means comprises: a parameter table having a first memory storing a plurality of sets of filter coefficients in the filter means that are associated with a first parameter based on each of a plurality of frequencies and a second parameter based on each of a plurality of levels representing a degree of attenuation or enhancement of a gain of a filter in the filter characteristics; and a filter coefficient generating means for extracting a relevant set of filter coefficients from the first memory of the parameter table with the use of the first parameter and the second parameter determined according to the frequency and a strength of the supplied musical sound signal, and outputting the extracted set of filter coefficients to the filter means.

The above and further novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 26 is a diagram for explaining key ranges according to the third embodiment;

DETAILED DESCRIPTION OF THE PREFERRED EMBODIMENT

A. First Embodiment

The present invention will hereinafter be described in detail with reference to a first embodiment shown in the accompanying drawings.

Figure 1:
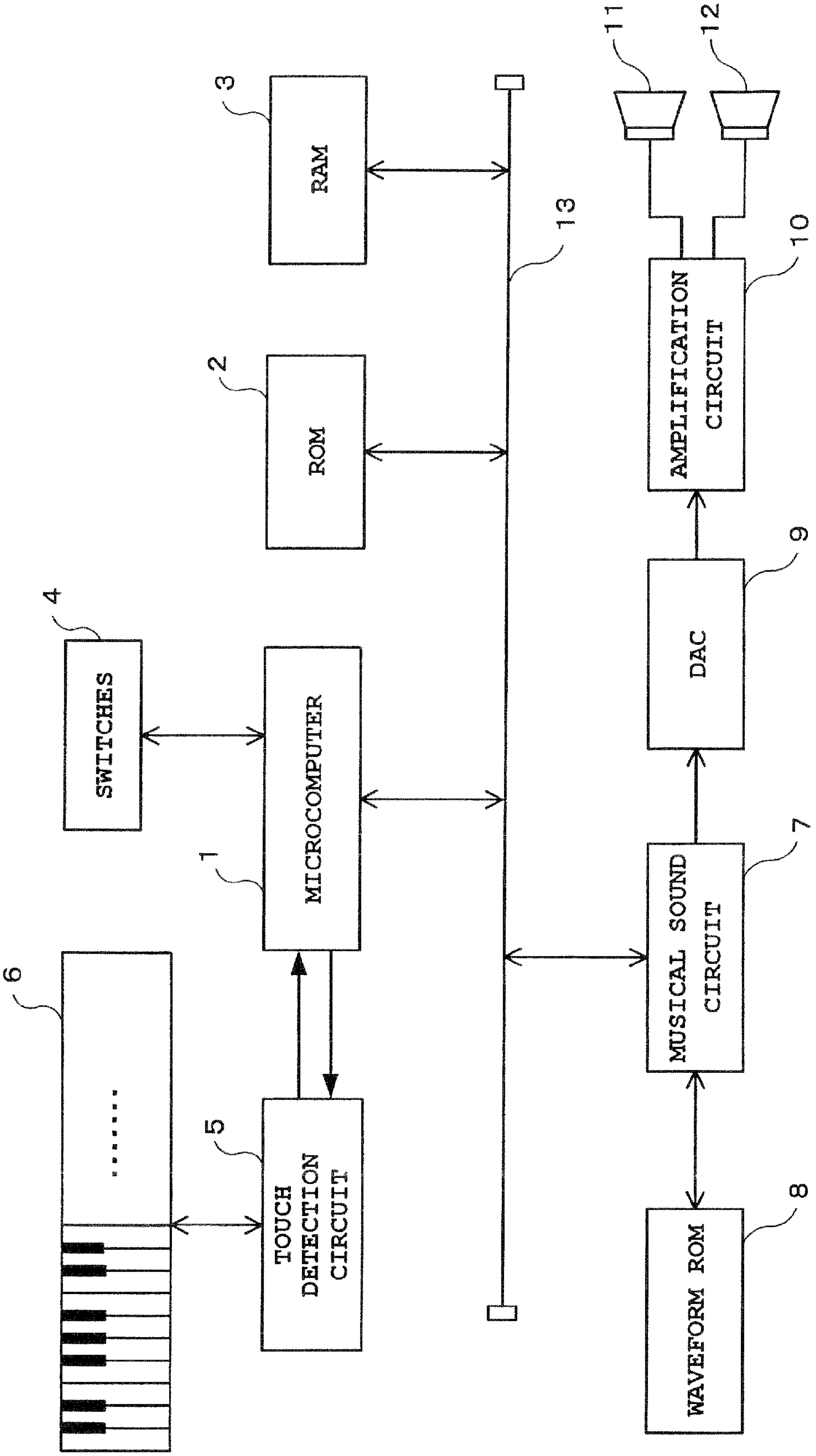
FIG. 1 is a block diagram showing an outline of an electronic musical instrument according to a first embodiment of the invention.

FIG. 1 is a block diagram showing an outline of an electronic musical instrument according to an embodiment of the present invention. As shown in FIG. 1, the electronic musical instrument includes a microcomputer 1, a ROM (Read Only Memory) 2, a RAM (Random Access Memory) 3, switches 4, a touch detection circuit 5, a keyboard 6, a musical sound generation circuit 7, a waveform ROM 8, a D/A converter (DAC) 9, an amplification circuit 10, and speakers 11 and 12. The microcomputer 1, the ROM 2, the RAM 3, the touch detection circuit 5, and the musical sound generation circuit 7 are connected to a data bus 13.

The microcomputer 1 controls the entire electronic musical instrument, reads a program and data from the ROM 2 storing programs and data, and executes the program. Data and the like generated by executing a program are stored in the RAM 3 as a work area. The switches 4 are arranged on the console panel of the electronic musical instrument. The microcomputer 1 detects a performer's operation on the switches 4. The touch detection circuit 5 transmits a scanning signal to the keyboard 6 at a given timing. The touch detection circuit 5 generates performance operation data (sound pitch and touch response data) in response to turning on 2 switches arranged on each key of the keyboard 6, and outputs the generated performance operation data to the microcomputer 1. In this embodiment, the keyboard 6 has 88 keys. Each key is arranged with 2 switches in the longitudinal direction. When a key is touched, the first switch is turned on. Then, when the key is further touched, the second switch is turned on.

The microcomputer 1 controls the musical sound generation circuit 7 to generate a given musical sound based on the tone color designated by operating the switches 4 and the performance operation data including the touch response data and the sound pitch outputted from the touch detection circuit 5. The musical sound generation circuit 7 reads the waveform data of the tone color designated by the waveform ROM 8, generates a musical sound with the sound pitch and the sound volume (velocity) according to the performance operation data, and outputs the musical sound to the DAC 9. The DAC 9 converts the digital data outputted from the musical sound generation circuit 7 to an analog signal. The analog signal is emitted from the speakers 11, 12 via the amplification circuit 10.

Figure 2:
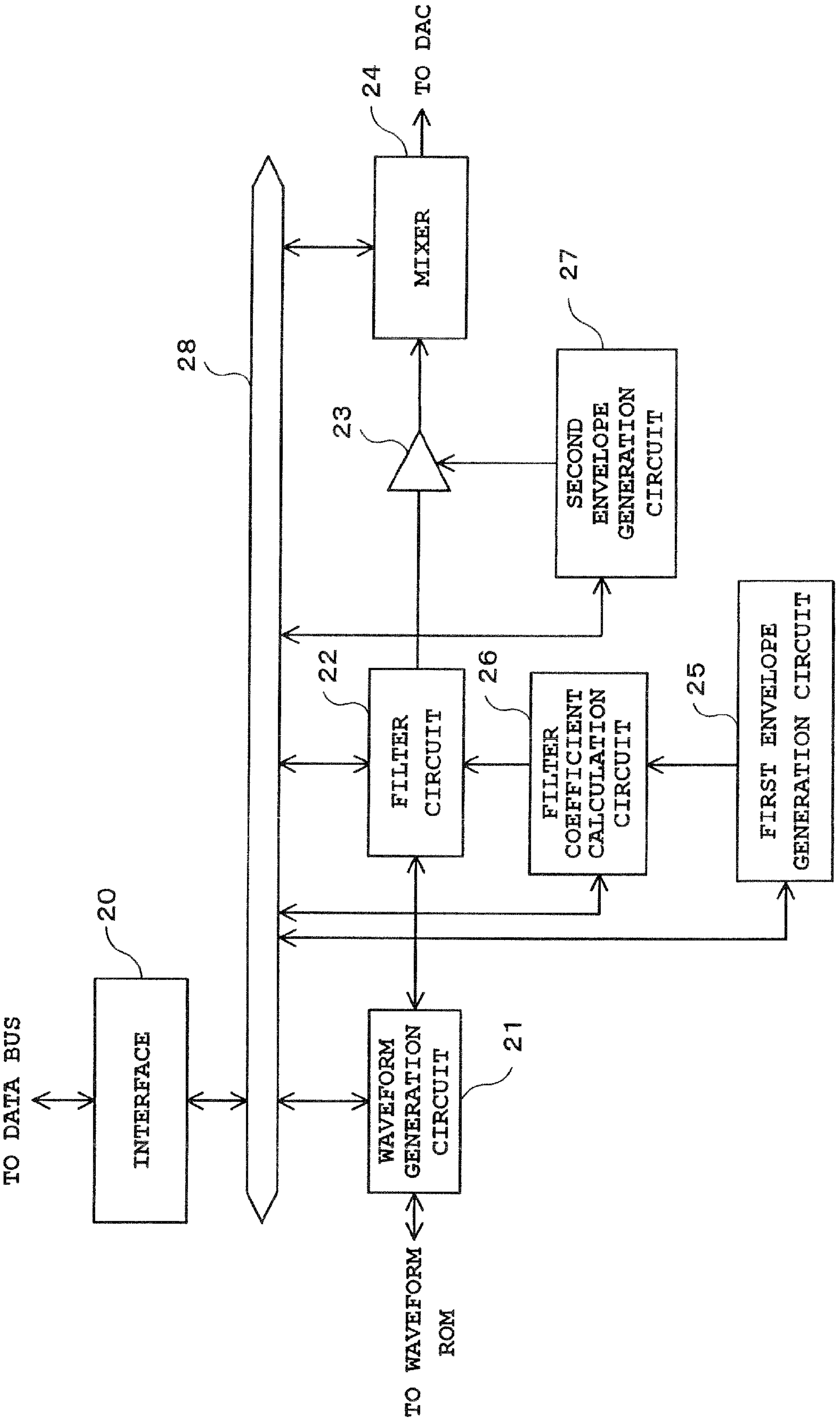
FIG. 2 is a block diagram showing in more detail a musical sound generation circuit according to the first embodiment.

FIG. 2 is a block diagram showing in more detail the musical sound generation circuit according to this embodiment. As shown in FIG. 2, the musical sound generation circuit 7 has an interface 20, a waveform generation circuit 21, a filter circuit 22, a multiplier circuit 23, a mixer 24, a first envelope generation circuit 25, a filter coefficient calculation circuit 26, and a second envelope generation circuit 27. The interface 20, the waveform generation circuit 21, the filter circuit 22, the mixer 24, the first envelope generation circuit 25, the filter coefficient calculation circuit 26, and the second envelope generation circuit 27 are connected to an internal bus 28.

The interface 20 is connected to the data bus 13 shown in FIG. 1. The interface 20 writes setting data and the like into each computing unit such as the waveform generation circuit 21 and the filter circuit 22 in the musical sound generation circuit 7 via the internal bus 28. The waveform generation circuit 21 is connected to the waveform ROM 8, reads PCM data from a given address in the waveform ROM 8, and generates musical sound waveform data of the frequency corresponding to the sound pitch in the performance operation data.

The filter coefficient circuit 26 calculates a filter coefficient according to a parameter based on a performance operation signal given from the microcomputer 1 via the interface 20 and a first envelope signal that is outputted from the first envelope generation circuit 25 and is changed as time goes on. The frequency characteristics are changed according to the first envelope signal, and thus the filter coefficient is changed as time goes on. The filter circuit 22 provides filter processing for musical sound waveform data according to the filter coefficient.

The multiplier 23 multiplies the musical sound waveform data by a second envelope signal that is outputted from the second envelope generation circuit 27 and is changed as time goes on. Thereby, rise and decay of musical sounds corresponding to turning on/off the keys of the keyboard 6 and the sound volume corresponding to the touch response data are controlled. The waveform generation circuit 21, the filter circuit 22, the first envelope generation circuit 25, the filter coefficient calculation circuit 26, the multiplier 23, and the second envelope generation circuit 27 can process the maximum simultaneous sound number in a manner of time division, and thereby can generate the sufficient number of channels of musical sounds for keyboard performance. The mixer 24 accumulates the generated musical sounds of the channels of the maximum simultaneous sound number with the use of a given weighting, and finally allocates the result as 2 right and left channel musical sounds. The output from the mixer 24 is outputted to the DAC 9.

Figure 3:
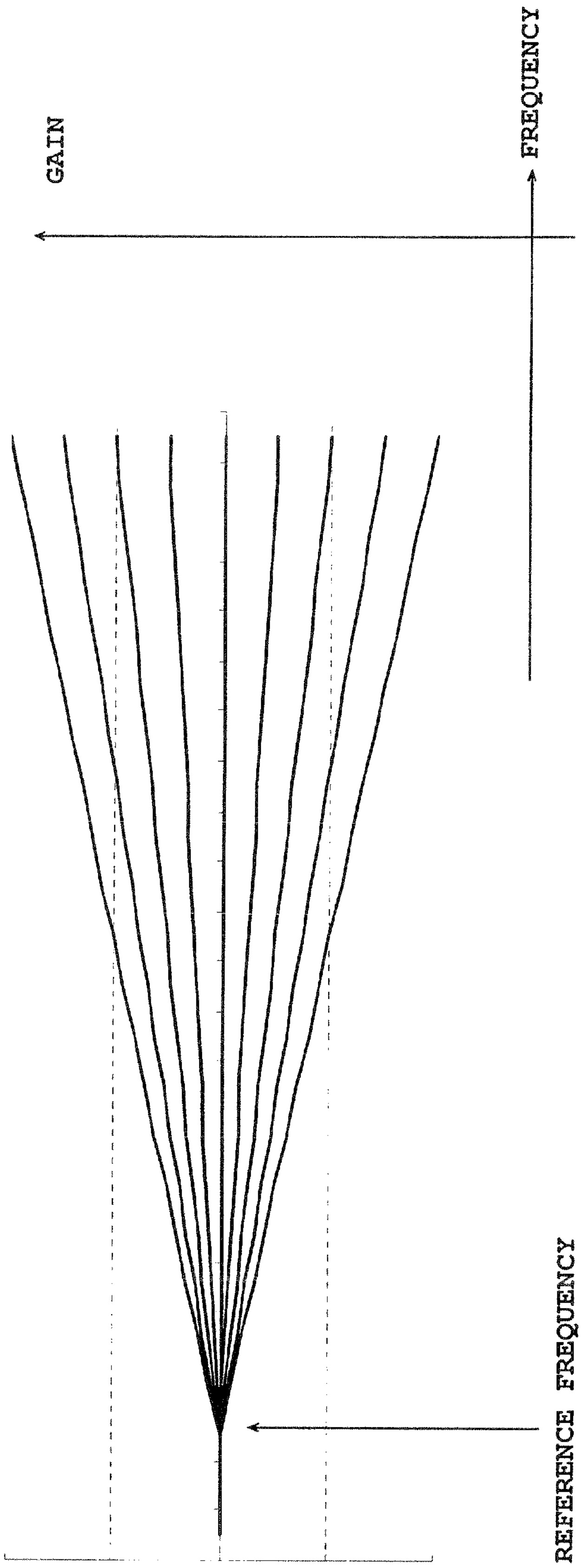
FIG. 3 is a diagram explaining ideal filter characteristics for realizing a tone color filter of an acoustic piano according to strong and weak performances.

A description will hereinafter be given of outlines of the filter circuit 22 and the filter coefficient calculation circuit 26 according to the present invention. FIG. 3 is a diagram for explaining ideal filter characteristics to realize a tone color filter of an acoustic piano according to strong and weak performance. In FIG. 3, the vertical axis represents the gain, and the horizontal axis represents the linear frequency.

Figure 13A:
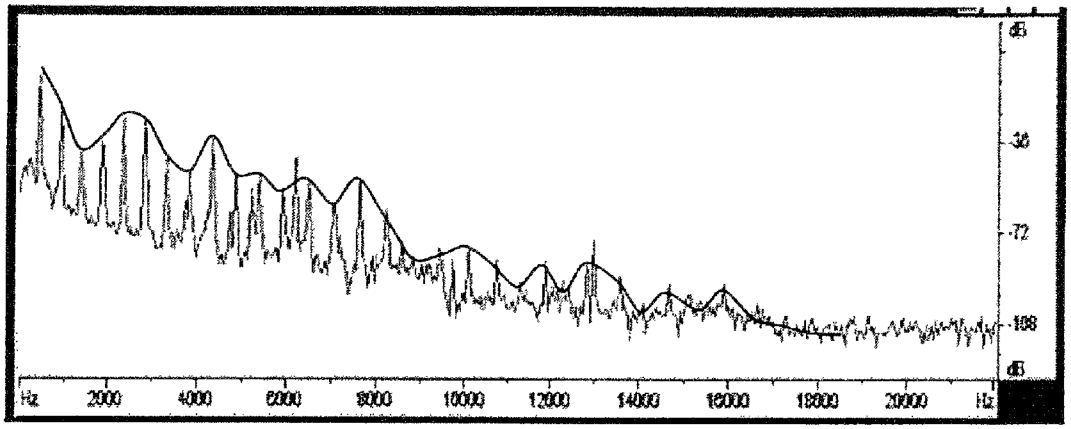
FIG. 13A PRIOR ART
FIGS. 13A and 13B are graphs showing spectrums calculated based on the respective waveforms of FIGS. 12A and 12B in conventional prior art.
Figure 13B:
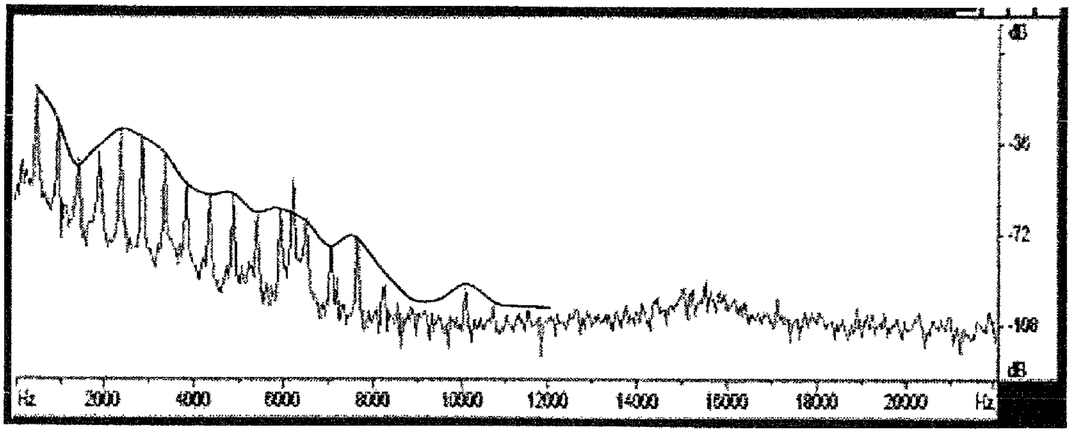
FIG. 13B PRIOR ART
Figure 14:
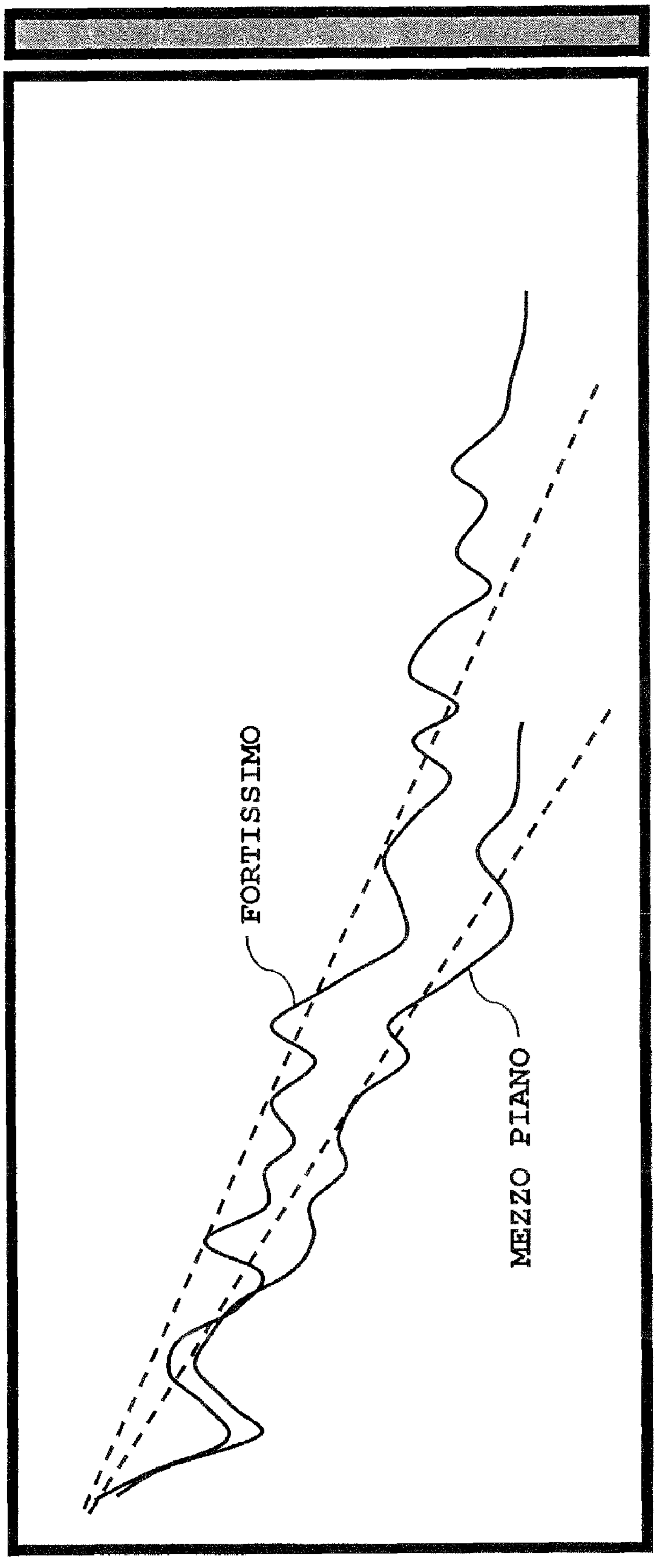
FIG. 14 PRIOR ART
FIG. 14 is a diagram showing spectrum envelopes extracted from the spectrums shown in FIGS. 13A and 13B in conventional prior art.
Figure 15:
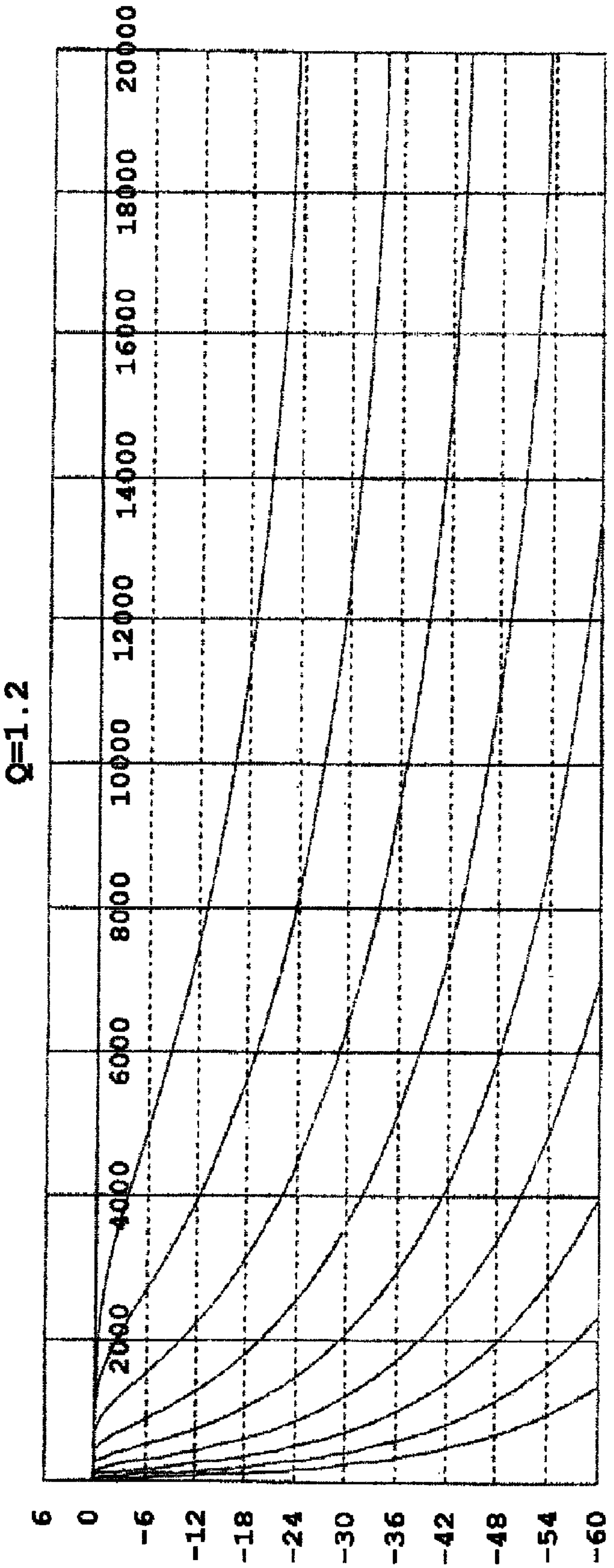
FIG. 15 PRIOR ART
FIG. 15 is a graph showing filter characteristics when fc is changed as a parameter in an existing feedback secondary filter in conventional prior art.

As shown in FIG. 3, the ideal filter characteristics are inferred from the spectrum envelopes of the acoustic piano shown in FIG. 13A and FIG. 13B. In the figure, harmonic tone elements in relation to the fundamental wave are attenuated approximately linearly from a certain point based on the fundamental wave. The slope thereof is small when the sound volume is small (that is, the degree of the slope down to the right is large: small slope). The slope thereof becomes larger as the sound volume becomes larger (that is, the degree of the slope down to the right becomes smaller and gets closer to horizontal state: large slope).

Hereinafter the point (frequency) on which attenuation or expansion is started linearly based on the fundamental wave is referred to as reference frequency; the attenuation amount (dB) in the frequency one half of sampling frequency fs is referred to as gain; and the frequency in which the gain is changed to a given ratio thereof (in this embodiment, the frequency in which the attenuation amount in fs/2 is changed to one half thereof) is referred to as turnover frequency. The degree of linear attenuation or linear expansion from the reference frequency is referred to as slope. For the slope, the frequency axis is indicated as the x axis, and the attenuation amount is indicated as the y axis. Therefore, the larger the negative attenuation amount is, the smaller the slope in the frequency characteristics is. As the negative attenuation amount becomes closer to 0, the slope becomes larger and gets closer to 0. The larger the positive attenuation amount is, the larger the slope in the frequency characteristics is.

Further, in this embodiment, as the fundamental wave is changed, the reference frequency is changed. As the reference frequency is changed, the turnover frequency is changed according to a constant rule.

In this embodiment, as described later, the filter circuit is controlled by the turnover frequency changed based on the fundamental wave and the gain representing the filter depth. Thereby, the higher harmonic wave element in relation to the fundamental wave controlled almost similarly to the actual tone color change of an acoustic piano is realized.

In this embodiment, consideration is made for not only attenuating the higher harmonic wave element but also expanding the higher harmonic wave element. Thereby, the tone color from the PCM data of the waveform ROM 8 can be changed more extensively. To realize such characteristics, the FIR (Finite Impulse Response) filter is suitably used. However, the FIR filter includes a large computing amount, thereby necessitates a large scale of hardware. Therefore, in this embodiment, the characteristics approximate to the ideal filter characteristics shown in FIG. 3 are realized with the use of a low order IIR (Infinite Impulse Response) filter, and the filter coefficient is controlled to become almost equal to that of the ideal filter characteristics.

To obtain the filter having the foregoing filter characteristics, various methods are supposable. To minimize the, computing amount, approximation in the primary IIR filter was tried, which was extended and thereby frequency characteristics close to the ideal characteristics were obtained. First, the transfer function of the primary IIR filter is expressed as Formula 2.

Formula 2

$$H(z) = \frac{1+b}{1+c}\frac{1+cz^{-1}}{1+bz^{-1}} \tag{2}$$

In Formula 2, where the maximum gain is expressed as A (that is, the maximum gain in the frequency one half of sampling frequency fs is expressed as A), A can be expressed as Formula 3.

Formula 3

$$A = 20\log_{10}|H(e^{j2\pi f/f_s})|_{f=f_s/2} \tag{3}$$

$$\therefore A = 20\log_{10}\left|\frac{1+b}{1+c}\cdot\frac{1+ce^{-j\pi}}{1+be^{-j\pi}}\right| = 20\log_{10}\left|\frac{1+b}{1+c}\cdot\frac{1-c}{1-b}\right|$$

Where the maximum gain is changed to one half thereof in turnover frequency f0, Formula 4 can be derived.

Formula 4

$$A/2 = 20\log_{10}|H(e^{j2\pi f/f_s})|_{f=f_0} \tag{4}$$

$$\therefore A = 20\log_{10}\left|\frac{1+b}{1+c}\cdot\frac{1+ce^{-j2\pi f_0/f_s}}{1+be^{-j2\pi f_0/f_s}}\right|^2$$

When the foregoing formulas 3 and 4 are resolved, coefficients b and c can be expressed as shown in Formulas 5 and 6.

Formula 5

$$b = -\frac{\dfrac{1+10^{\frac{A}{20}}+\left(1-10^{\frac{A}{20}}\right)}{\cos(2\pi f_0/f_s)}}{\dfrac{1-10^{\frac{A}{20}}+\left(1+10^{\frac{A}{20}}\right)}{\cos(2\pi f_0/f_s)}} \pm \sqrt{\left\{\frac{\dfrac{1+10^{\frac{A}{20}}+\left(1-10^{\frac{A}{20}}\right)}{\cos(2\pi f_0/f_s)}}{\dfrac{1-10^{\frac{A}{20}}+\left(1+10^{\frac{A}{20}}\right)}{\cos(2\pi f_0/f_s)}}\right\}^2-1} \tag{5}$$

Formula 6

$$c = \frac{b+\left(1-10^{\frac{A}{20}}\right)/\left(1+10^{\frac{A}{20}}\right)}{1+b\left(1-10^{\frac{A}{20}}\right)/\left(1+10^{\frac{A}{20}}\right)} \tag{6}$$

Therefore, coefficients b and c of the primary IIR filter shown in Formula 2 can be obtained as shown in Formulas 5 and 6, with the use of maximum gain A and turnover frequency f0. Though 2 sets of the filter coefficients can be obtained with the use of the foregoing Formula 5, one thereof that is easily controlled based on the coefficient range can be selected.

The attenuation characteristics of the primary IIR filter are excessively moderate. Therefore, in this embodiment, 2 primary IIR filters with the turnover frequency different from each other are connected in series to obtain a secondary IIR filter, and thereby filter characteristics more approximate to the ideal filter are obtained. Formula 7 shows the transfer function of the secondary IIF filter in which the primary IIR filters are connected in series.

Formula 7

$$\begin{aligned} H(z) &= \frac{1+b_0}{1+c_0}\frac{1+c_0z^{-1}}{1+b_0z^{-1}}\times \\ &\quad \frac{1+b_1}{1+c_1}\frac{1+c_1z^{-1}}{1+b_1z^{-1}} \\ &= \frac{d+ez^{-1}+fz^{-2}}{1+bz^{-1}+cz^{-2}} \end{aligned} \tag{7}$$

Figure 4:
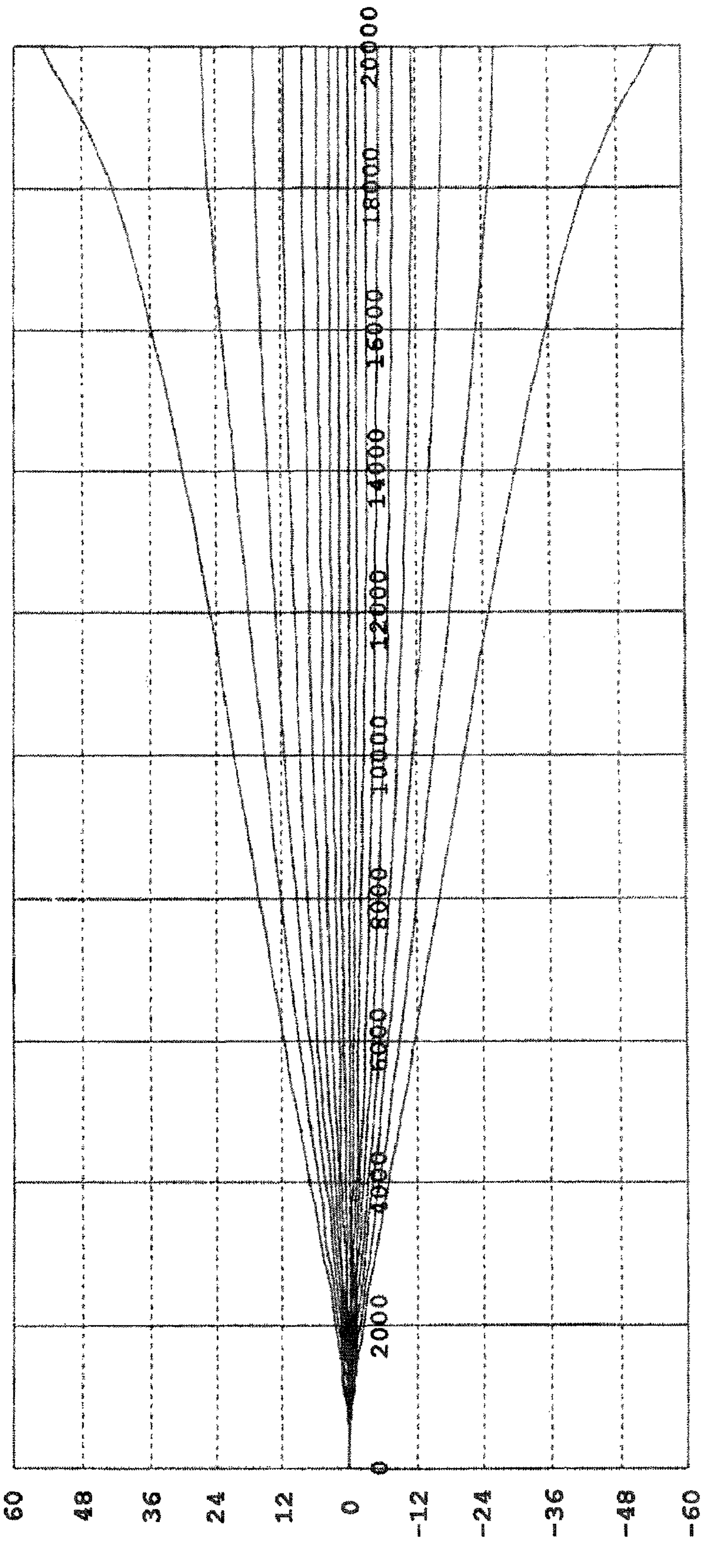
FIG. 4 shows characteristics of a secondary IIR filter when a gain is changed by a certain turnover frequency.

FIG. 4 shows the characteristics of the secondary IIR filter when the gain is changed in a certain turnover frequency. It is understandable that the characteristics shown in FIG. 4 are approximate to the ideal characteristics shown in FIG. 3. In this embodiment, the ideal filter is approximated by the secondary IIR filter. By improving the filter order, the filter characteristics can be further approximated to the characteristics of the ideal filter.

Figure 5:
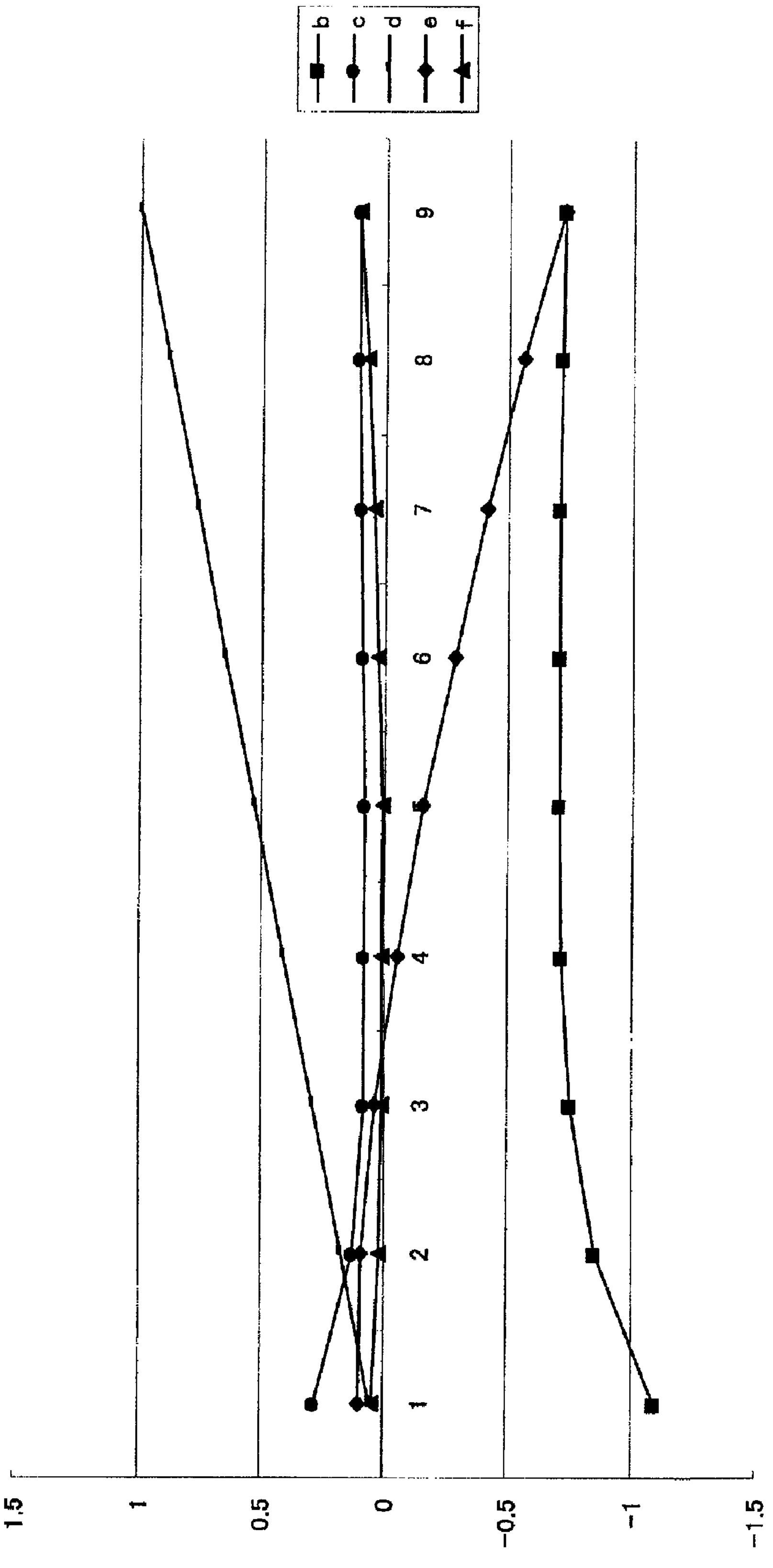
FIG. 5 is a graph showing secondary filter coefficients for realizing the filter characteristics shown in FIG. 4.

FIG. 5 is a graph showing secondary filter coefficients to realize the filter characteristics shown in FIG. 4. The horizontal axis represents negative gain levels. Level 1 represents the gain in which the negative level is largest (that is, the slope is the minimum), and level 0 represents the gain in which the negative level is smallest (that is, the slope is 0). As just described, in this embodiment, in respective levels 1 to 9, filter coefficients b, c, d, e and f are determined.

The filter coefficients for the positive gain can be calculated by exchanging the denominator and the numerator in the foregoing Formula 7 (refer to Formula 8).

Formula 8

$$\begin{aligned} H(z) &= \frac{1+bz^{-1}+cz^{-2}}{d+ez^{-1}+fz^{-2}} \\ &= \frac{1/d+b/dz^{-1}+c/dz^{-2}}{1+e/dz^{-1}+f/dz^{-2}} \end{aligned} \tag{8}$$

Therefore, by respectively exchanging negative gain coefficients b to f as b:e/d, c:f/d, d:l/d, e:b/d, and f:c/d, the filter coefficients for the positive gain characteristics can be obtained.

In this embodiment, the filter coefficients are not calculated by computing. Appropriate filter coefficients are calculated by providing a table (parameter table) with the address of the turnover frequency and the gain level for the filter coefficient calculation circuit 26, extracting a data value from the table, and interpolating the data value.

Figure 11A:
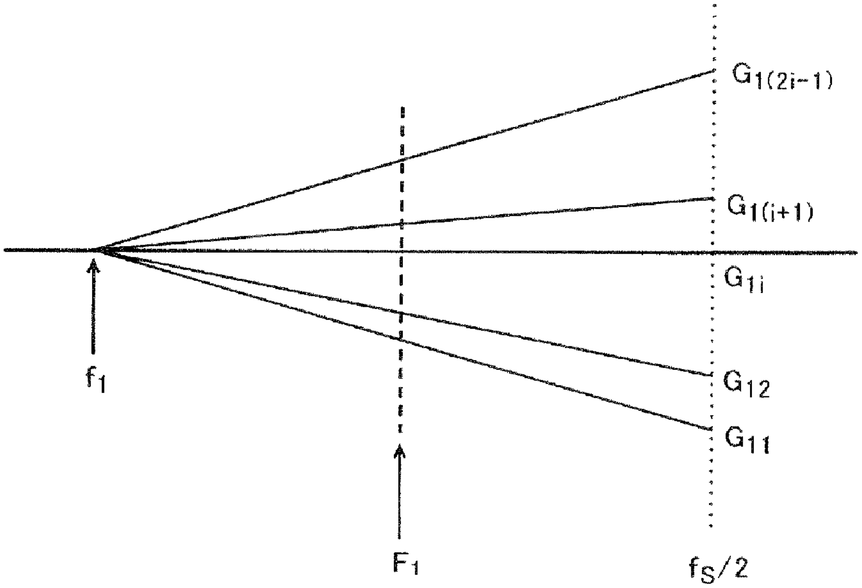
FIGS. 11A and 11B are diagrams for explaining filter characteristics and a parameter table in the first embodiment.
Figure 11B:
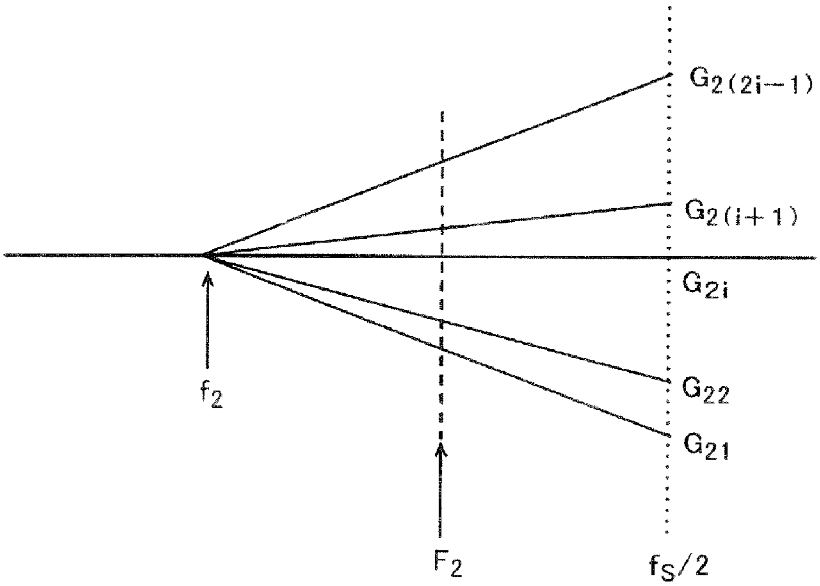
Figure 12A:
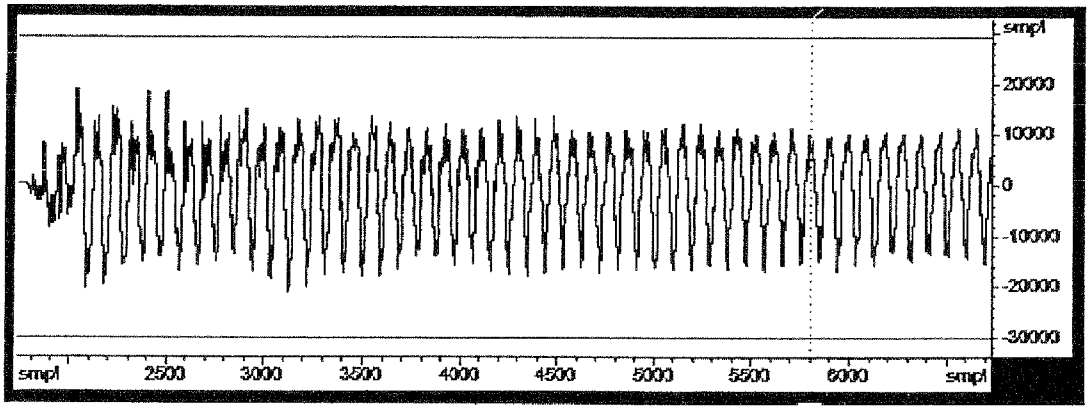
FIG. 12A PRIOR ART
FIGS. 12A and 12B are graphs showing waveforms of an acoustic piano in conventional prior art.
Figure 12B:
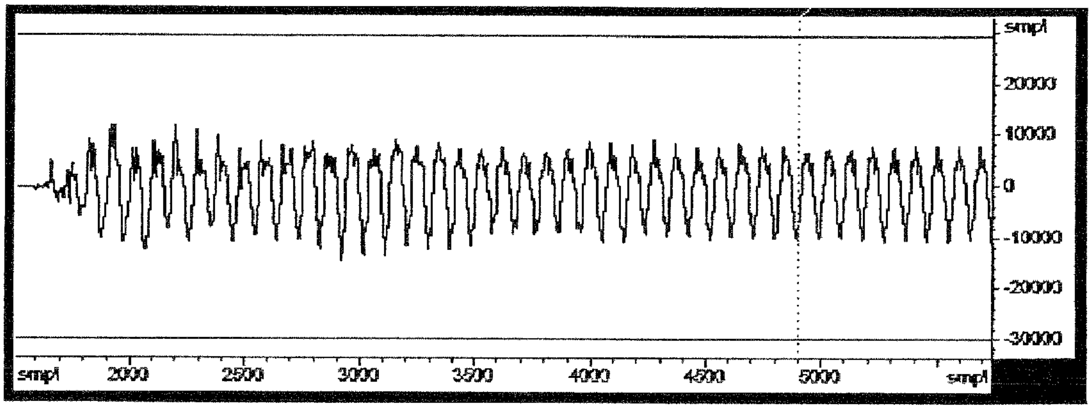
FIG. 12B PRIOR ART

FIGS. 11A and 11B are diagrams for explaining the filter characteristics and the parameter table in this embodiment. FIG. 11A is a diagram showing the filter characteristics in the case of turnover frequency $F_1$ based on certain reference frequency $f_1$. As described above, reference frequency $f_1$ is determined according to the frequency of the fundamental wave. For example, the reference frequency may be almost the same as that of the fundamental wave, or may be a frequency obtained by multiplying the frequency of the fundamental wave by a given number. As shown in FIG. 11A, the filter characteristics have a plurality of slopes for single turnover frequency $F_1$. In the example of FIG. 11A, as the negative characteristics (attenuation characteristics), gain levels $G_{11}$, $G_{12}$ . . . $G_{1i}$ (=attenuation "0") are shown in ascending order; and as the positive characteristics, $G_{1(i+1)}$ . . . $G_{1(2i-1)}$ are shown. Further, when the reference frequency is changed from $f_1$ to $f_2$ ($f_1<f_2$) as the fundamental wave is changed, as shown in FIG. 11B, turnover frequency $F_2$ is changed as the reference frequency is changed. Gain levels $G_{21}$, $G_{22}$ . . . $G_{2i}$ . . . $G_{2(2i-1)}$ can be also changed.

For example, in FIG. 11A, for single turnover frequency $F_1$, 2i−1 number of levels exist. Therefore, in this example, for each combination of turnover frequency $F_1$ and a given level, one set of filter coefficients (b, c, d, e, and f) exists. That is, when the number of levels is 2i−1, 2i−1 sets of filter coefficients exist. The same applies to FIG. 11B. Therefore, when the number of turnover frequencies is n, n×the number of levels (in the example of FIGS. 11A and 11B, (2i−1)) sets of filter coefficients can exist.

When the set of filter coefficients for each gain is retained for every turnover frequency, an extremely large table (the set number of turnover frequencies×the set number of gains× types of filter coefficients (5)) should be prepared. Thus, the set number of turnover frequencies and the set number of gains are limited, only a table storing a series of filter coefficients corresponding to the combinations thereof is prepared, and interpolation (two-dimensional interpolation) is realized for both the turnover frequency and the gain, and thereby the table size is decreased and the filter coefficients are set appropriately.

Figure 16:
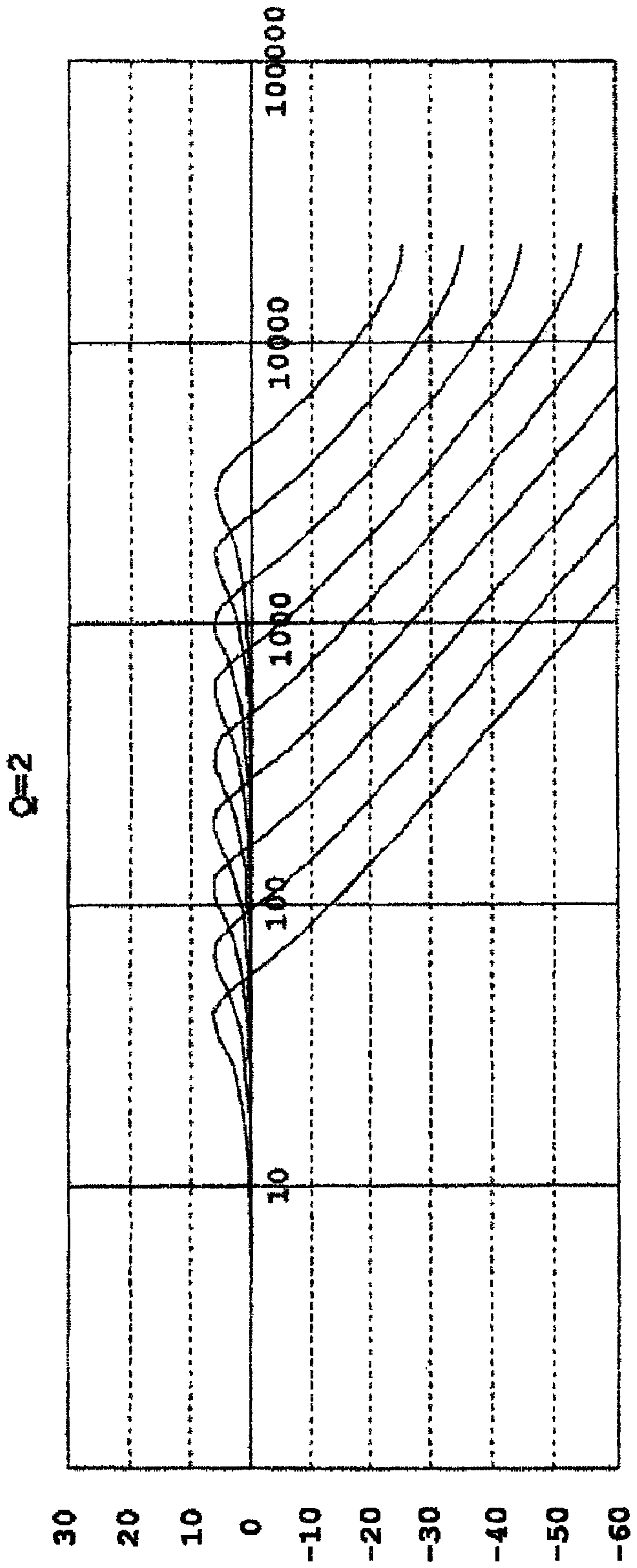
FIG. 16 is a graph showing respective filter characteristics (frequency characteristics) when cutoff fc is changed in a certain band width (Q=2)

FIG. 16 is a graph showing respective filter characteristics (frequency characteristics) when cutoff fc is exponentially changed to 3000 Hz, 1765 Hz, 1038 Hz, 611 Hz, 359 Hz, 211 Hz, 124 Hz, 73 Hz, and 43 Hz, where Q is 2.

Figure 17:
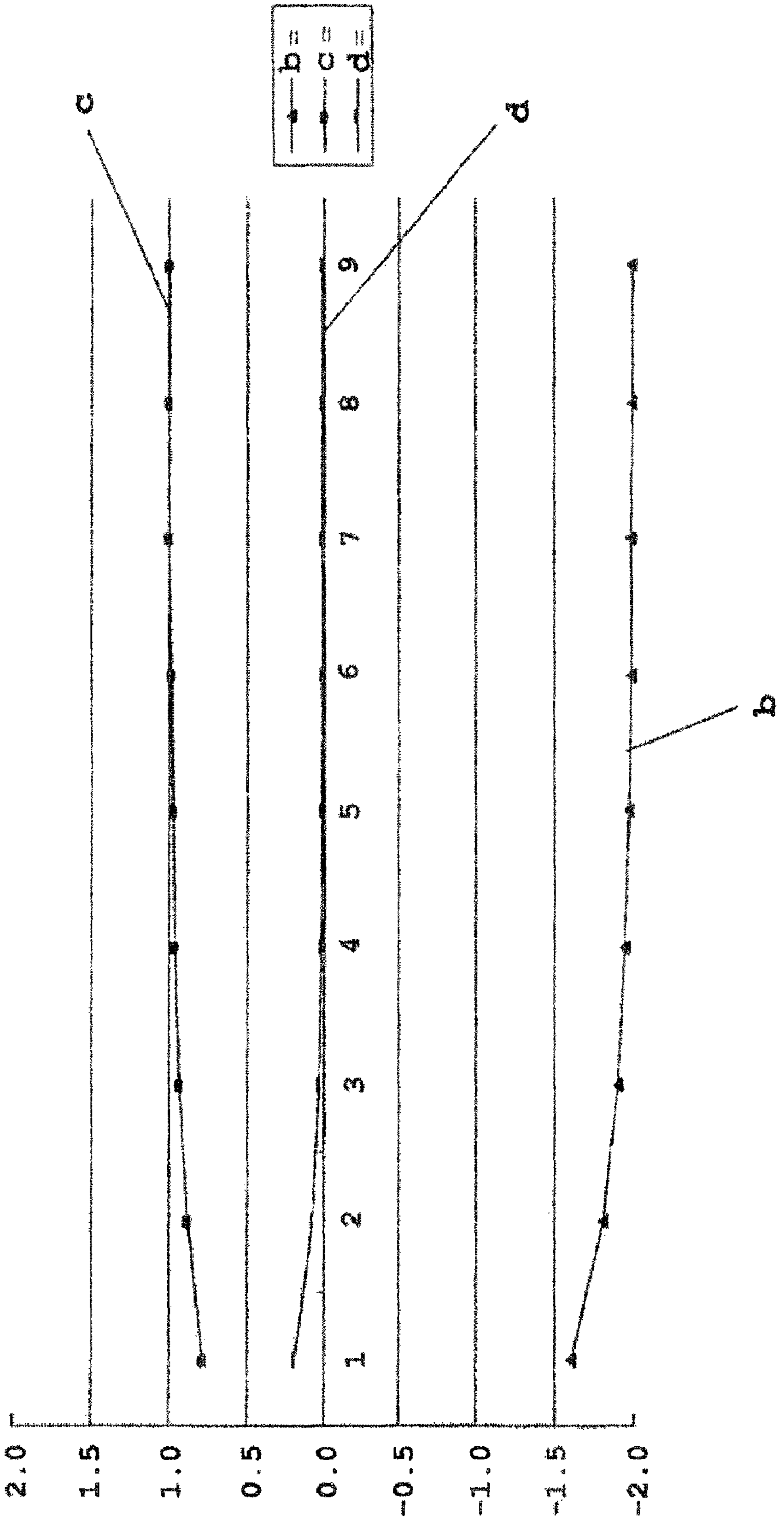
FIG. 17 is a graph showing filter coefficients b to d in respective states of cutoff fc.

FIG. 17 is a graph showing filter coefficients b to d in the respective states of cutoff fc. The transfer function of the exiting secondary IIR filter is expressed as Formula 9.

Formula 9

$$H(z)=f^2/(1+(-2+f^2+f/Q)z^{-1}+(1-f/Q)z^{-2}) \quad (9)$$

Therefore, filter coefficients e and f are fixed as e=0 and f=0.

A description will be given in more detail of structures of the filter coefficient calculation circuit 26 and the filter circuit 22 according to this embodiment.

Figure 6:
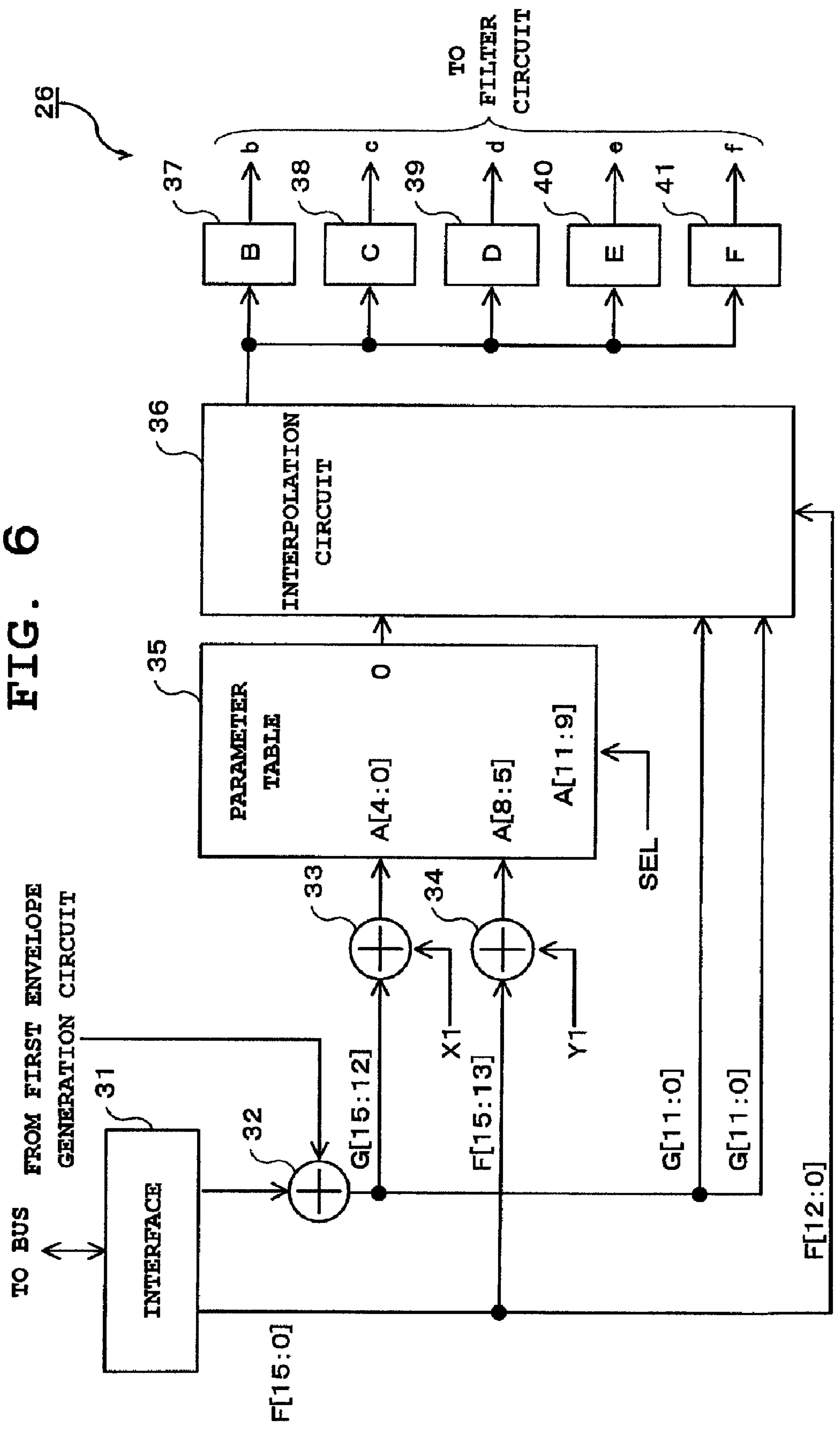
FIG. 6 is a block diagram showing a structure of a filter coefficient calculation circuit according to the first embodiment.

FIG. 6 is a block diagram showing the structure of the filter coefficient calculation circuit according to this embodiment. As shown in FIG. 6, the filter coefficient calculation circuit 26 includes an interface 31, adders 32 to 34, a parameter table 35, an interpolation circuit 36, and registers 37 to 41. Though not shown in FIG. 6, the filter coefficient calculation circuit 26 has a control circuit that outputs increment signals X1, Y1 as address signals to the parameter table 35 and selection signal SEL of the parameter table 35 at a given timing.

The interface 31 is connected to the internal bus 28 of the musical sound generation circuit 7. The interface 31 receives and retains 2 types of parameters that are transmitted via the interface 20 from the microcomputer 1, that is, turnover frequency data F [15:0] and gain data G [15:0], and outputs such data into the filter calculation circuit 26. Turnover frequency data F corresponds to the foregoing turnover frequency. Gain data G corresponds to the foregoing gain. Gain data G [15:0] is given to the adder 32. As the other input, the first envelope signal changed as time goes on is given from the first envelope generation circuit 25 to the adder 32. Therefore, the value of the gain data G [15:0] outputted from the adder is changed as time goes on based on the first envelope signal.

Out of gain data G [15:0], G [15:12] is given to the adder 33. Further, out of turnover frequency data F [15:0], F [15:13] is given to the adder 45. In the adders 33, 34, if necessary, increment signal "1" is added at a given time, and the result is outputted as an address of the parameter table 35. In the adder 33, by adding increment signal X1 at the next timing subsequently to outputting G[15:12], continuing address (G[15:12]+1) can be outputted. In the adder 34, by adding increment signal Y1 at the next timing subsequently to outputting F [15:13], continuing address (F [15:13]+1) can be outputted.

A signal is given from the adder 33 to lower address A [4:0] of the parameter table 35. A signal is given from the adder 34 to upper address A [8:5]. Selection signal SEL is given from the control circuit (not shown) to the uppermost address A [11:9].

In this embodiment, the parameter table 35 stores 9 types of turnover frequencies×(hereinafter, "×" indicates "multiplied by")17 types of gains (8 types of negative gains, gain "0" and 9 types of positive gains)×5 types of filter coefficients. Therefore, the parameter table 35 stores 9×17×5=765 word filter number.

For the turnover frequency, to interpolate the upper 3 bit (8 types) values with lower 13 bits, 9 types of addresses are prepared. For the gain, to interpolate the upper 4 bit (16 types) values with lower 12 bits, 17 types of addresses are prepared. The selection signal SEL is used for selecting one of 5 types of coefficients b to f.

Output from the parameter table 35, that is, the set of the filter coefficients before interpolation is given to the interpolation circuit 36. Lower data F [12:0] of the turnover frequency data and lower data G [11:0] of the gain data are given to the interpolation circuit 36. In the interpolation circuit 36, 5 types of interpolated filter coefficients b to f are calculated and outputted. The registers 37 to 41 respectively retain interpolated filter coefficients b to f that are sequentially outputted.

Figure 7:
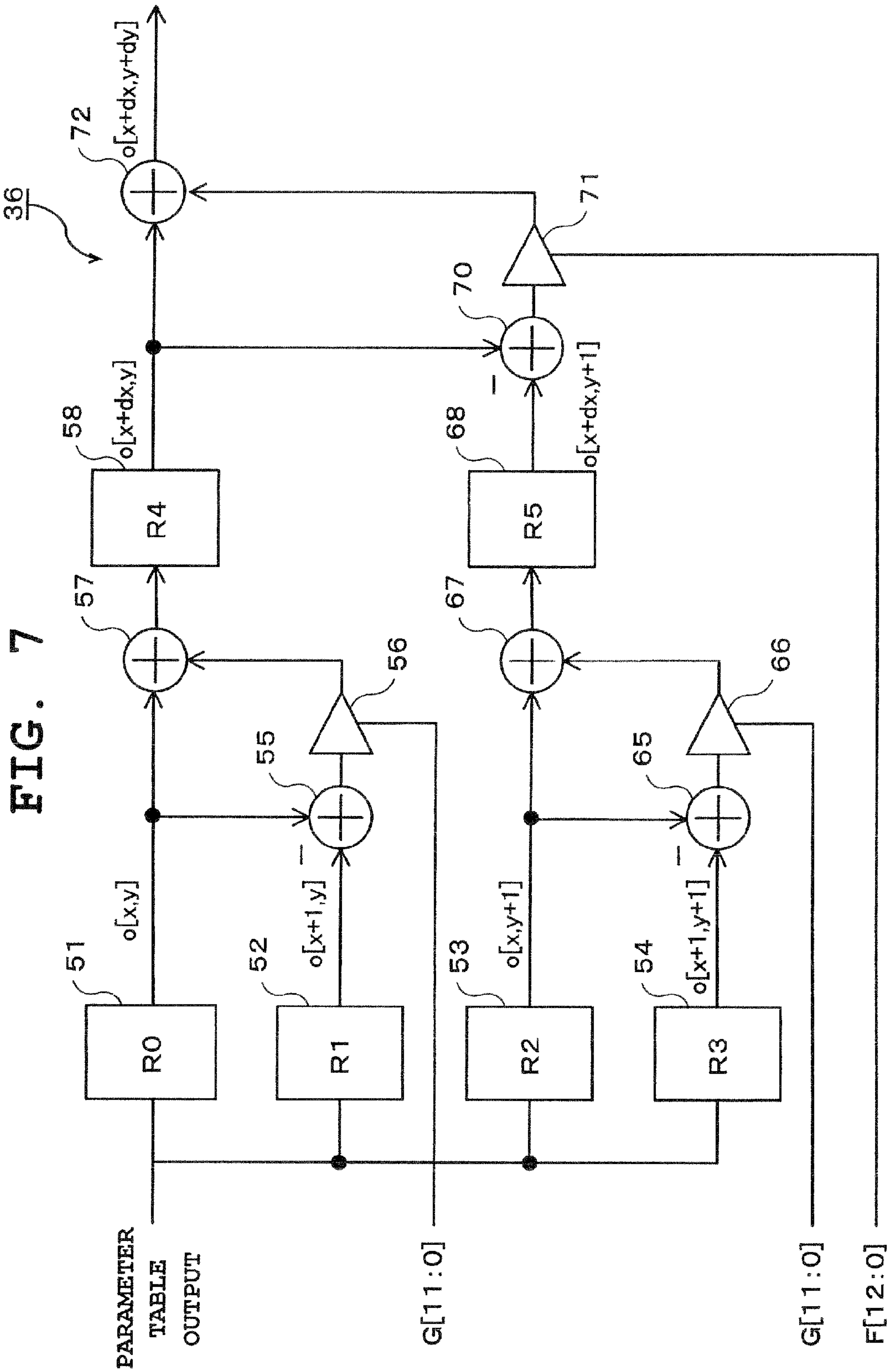
FIG. 7 is a block diagram showing in more detail an interpolation circuit according to this embodiment.

FIG. 7 is a block diagram showing in more detail the interpolation circuit according to this embodiment. As shown in FIG. 7, the interpolation circuit 36 has registers 51 to 54, a subtracter 55, a multiplier 56, an adder 57, a register 58, a subtracter 65, a multiplier 66, an adder 67, a register 68, a subtracter 70, a multiplier 71, and an adder 72.

The subtracter 55 calculates a difference value obtained by subtracting output of the register 51 from output of the register 52. The difference value is multiplied by lower data G [11:0] of the gain data in the multiplier 56. The resultant multiplication value is outputted to the adder 57. The adder 57 adds the multiplication value to the output from the register 51. The resultant additional value is stored in the register 58.

In the same manner, the subtracter 65 calculates a difference value obtained by subtracting output of the register 54 from output of the register 53. The difference value is multiplied by lower data G [11:0] of the gain data in the multiplier 66. The resultant multiplication value is outputted to the adder 67. The adder 67 adds the multiplication value to the output from the register 53. The resultant additional value is stored in the register 68.

Further, the subtracter 70 calculates a difference value obtained by subtracting output of the register 58 from output of the register 68. The difference value is multiplied by lower data F [12:0] of the turnover frequency data in the multiplier 71. The resultant multiplication value is outputted to the adder 72. The adder 72 adds the multiplication value to the output from the register 58. Output from the adder 72 becomes an interpolated filter coefficient.

Figure 8:
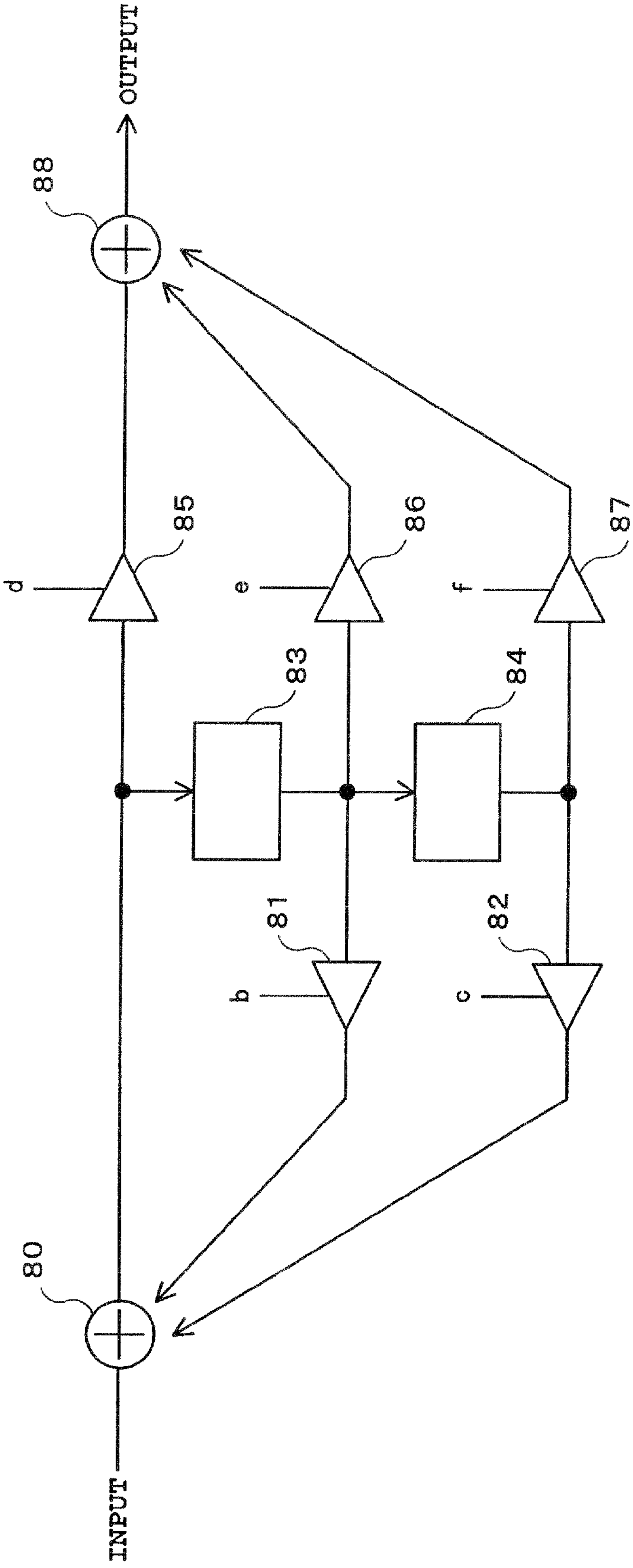
FIG. 8 is a block diagram showing an outline of a filter circuit according to the first embodiment.

FIG. 8 is a block diagram showing an outline of the filter circuit according to this embodiment. As shown in FIG. 8, the filter circuit 22 has adders 80 and 88; multipliers 81, 82, 85, 86, and 87; and delay circuits 83 and 84. Filter coefficients b, c, d, e, and f calculated in the filter coefficient calculation circuit 22 are given to each of the multipliers 81, 82, 85, 86, and 87. A signal applied to each input of the multiplier is multiplied by each filter coefficient.

Figure 9:
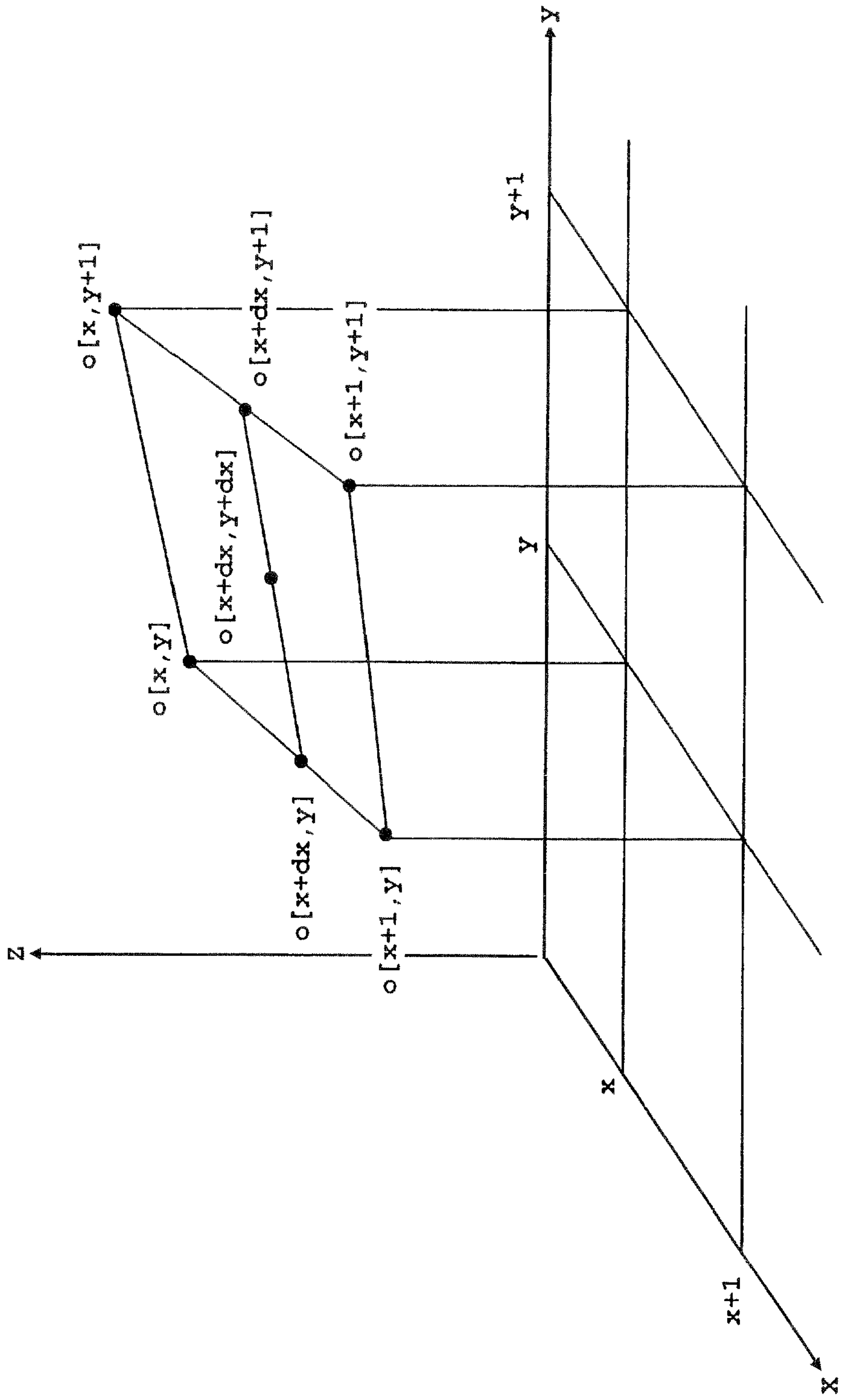
FIG. 9 is a diagram explaining two dimensional interpolation according to the first embodiment.

A description will be hereinafter given of two-dimensional interpolation according to this embodiment. FIG. 9 is a diagram for explaining the two-dimensional interpolation according to this embodiment. For convenience, x is G [15:12], dx is G [11:0], y is F [15:13], and dy is F [12:0]. The following values are stored in the registers 51 to 54 of FIG. 7.

Register 51: o [x, y] (o [x, y] represents output of the parameter table 35 where address is xy.)

Register 52: o [x+1, y]

Register 53: o [x, y+1]

Register 54: o [x+1, y+1]

The subtracter 55 subtracts output o [x, y] of the register 51 from output o [x+1, y] of the register 52. The multiplier 56 multiplies the subtraction value by dx. After that, the adder 57 adds the multiplication value to o [x, y]. The resultant additional value is stored in the register 58. Therefore, in the register 58, the following value is stored.

Register 58: o [x, y]+(o [x+1, y]−o [x, y])×dx=o [x+dx, y]

As shown in FIG. 9, such a value corresponds to the result from linear interpolation between o [x, y] and o [x+1, y] based on dx.

The subtracter 65 subtracts output o [x, y+1] of the register 53 from output o [x+1, y+1] of the register 54. The multiplier 66 multiplies the subtraction value by dx. After that, the adder 67 adds the multiplication value to o [x, y+1]. The resultant additional value is stored in the register 58. Therefore, in the register 68, the following value is stored.

Register 68: o [x, y+1]+(o [x+1, y+1]−o [x, y+1])×dx=o [x+dx, y+1]

As shown in FIG. 9, such a value corresponds to the result from linear interpolation between o [x, y+1] and o [x+1, y+1] based on dx.

Further, the subtracter 70 subtracts output o [x+dx, y] of the register 58 from output o [x+dx, y+1] of the register 68. The multiplier 71 multiplies the subtraction value by dy. After that, the adder 72 adds the multiplication value to o [x+dx, y]. The resultant additional value is outputted. Therefore, the output value is as follows.

Output value: o [x+dx, y]+(o [x+dx, y+1]−o [x+dx, y])×dy=o [x+dx, y+dy]

As shown in FIG. 9, the output value corresponds to the result from interpolation between o [x+dx, y] and o [x+dx, y+1] based on dy. Therefore the obtained output value is a two dimensional interpolation value based on dx, dy.

In this embodiment, selection signal SEL is sequentially changed, the values of filter coefficients b, c, d, e, and f before interpolation are outputted from the parameter table 35, and thereby the interpolation values of b, c, d, e, and f are generated and outputted in the interpolation circuit 36.

Figure 10:
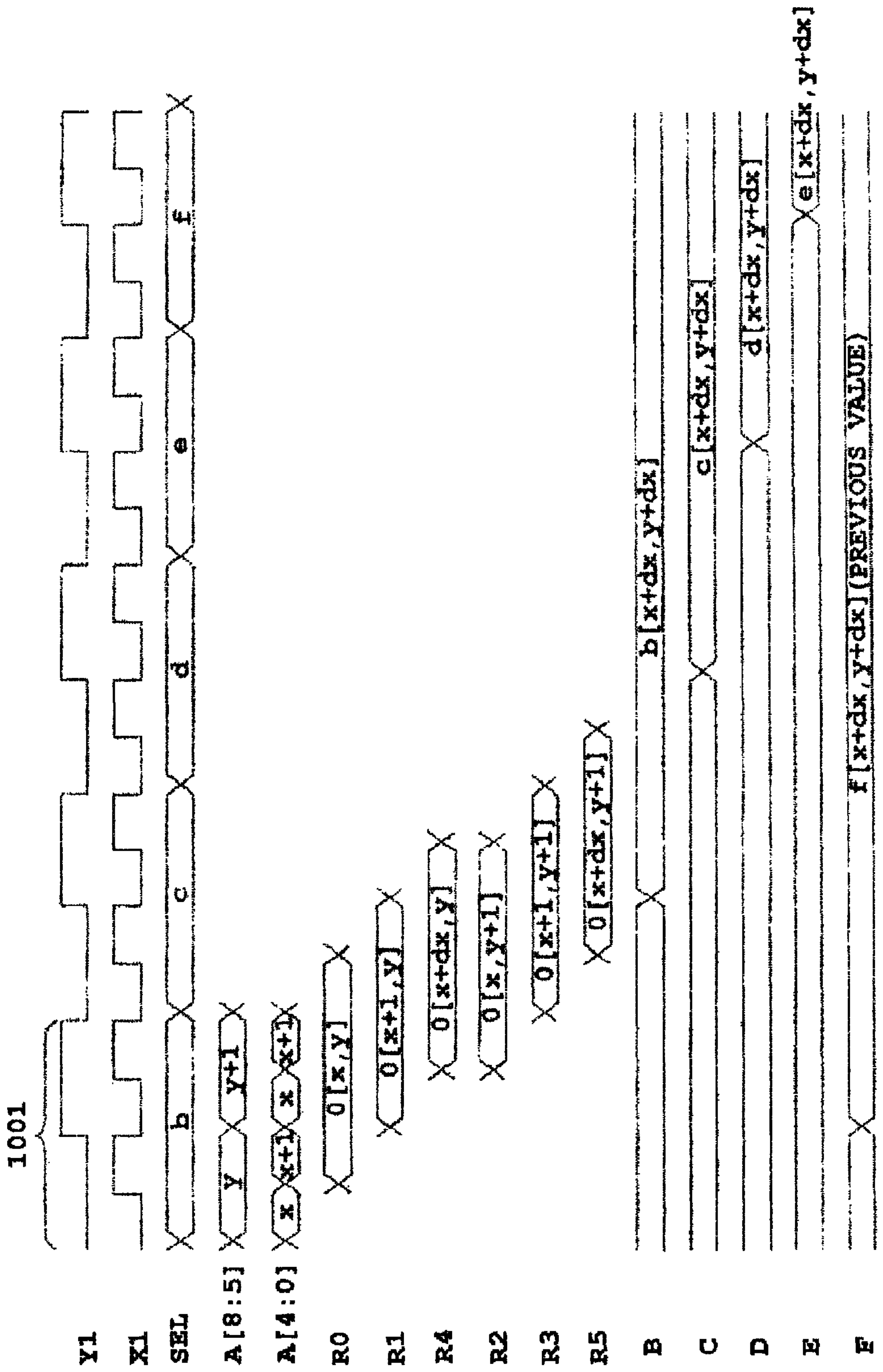
FIG. 10 is a timing chart in the case of calculating a filter coefficient according to the first embodiment.

FIG. 10 is a timing chart in the case of calculating the filter coefficients. In FIG. 10, R0 to R5 respectively correspond to the registers 51 to 54, 58 and 68 of FIG. 7, and B to F respectively correspond to the registers 37 to 41 of FIG. 6.

In FIG. 10, address A [4:0] is changed to “x” or “x+1” by signal X1, and address A [8:5] is changed to “y” or “y+1” by signal Y1. Address [9:11] is changed by selection signal SEL. In the first cycle of Y1 (refer to referential symbol 1001), selection signal SEL represents “b”. Therefore, based on 4 types of addresses given to the parameter table 35 in the first cycle of Y1, o [x, y], o [x+1, y], o [x, y+1], and o [x+1, y+1] of the filter coefficient bare outputted and stored in R0 to R3.

Based on o [x, y] and o [x+1, y] respectively stored in R0 and R1, o [x+dx, y] is calculated, and the result is stored in R4. Based on o [x, y+1] and o [x+1, y+1] respectively stored in R2 and R3, o [x+dx, y+1] is calculated, and the result is stored in R5. Based on o [x+dx, y] and o [x+dx, y+1] stored in R4 and R5, value b [x+dx, y+dy] after interpolation of filter coefficient b is calculated, and the result is stored in B.

In the same manner, when selection signal SEL indicates “c”, “d”, “e”, and “f” respective values of filter coefficients c to f after interpolation, c[x+dx, y+dy], d[x+dx, y+dy], e[x+dx, y+dy], and f[x+dx, y+dy] are calculated finally. The calculated values are respectively stored in C to F.

According to this embodiment, the parameter table that outputs the filter coefficients based on the turnover frequency and the gain is provided, and the filter circuit is controlled by the filter coefficients using the parameter table. The turnover frequency is based on the frequency of the fundamental wave of the musical sound to be sounded. The gain represents the attenuation degree (or enhancement degree). Therefore, it is possible to realize the digital filter having the filter characteristics significantly approximate to the filter characteristics of an acoustic musical instrument, in particular an acoustic piano by intuitively understandable parameters without performing complicated computing.

Further, according to this embodiment, the first envelope generation circuit outputs the envelope data that is changed as time goes on. The envelope data is added to the gain data in the filter coefficient calculation circuit. Therefore, it is possible to realize change overtime of gain attenuation (or enhancement) by the filter and realize desired tone color change with the use of the simple circuit structure.

Furthermore, according to this embodiment, with the use of the address composed of the upper bit of the turnover frequency data and the upper bit of the gain data, the parameter table outputs a rough filter coefficient. The rough filter coefficient is two-dimensionally corrected by the lower bit of the turnover frequency data and the lower bit of the gain data, and thereby the corrected filter coefficient is obtained. Thereby, it is possible to obtain the precise and appropriate filter coefficient, without increasing the number of data (coefficients) stored in the parameter table so much.

B. Second Embodiment

Next, a description will be given of a second embodiment of the invention.

In an electronic musical instrument, not only a sound of an acoustic musical instrument such as a piano, but also a tone color peculiar to a synthesizer incapable of being generated by an acoustic musical instrument should be generated. Accordingly, if the digital filter of the electronic musical instrument includes only the frequency characteristics suitable for tone color change of an acoustic musical instrument sound, it results in a problem that the electronic musical instrument is not able to address various musical categories.

This embodiment provides a filter device and an electronic musical instrument that can realize not only tone color change equal to tone color change of an acoustic musical instrument, but also tone color change peculiar to a synthesizer.

Figure 18:
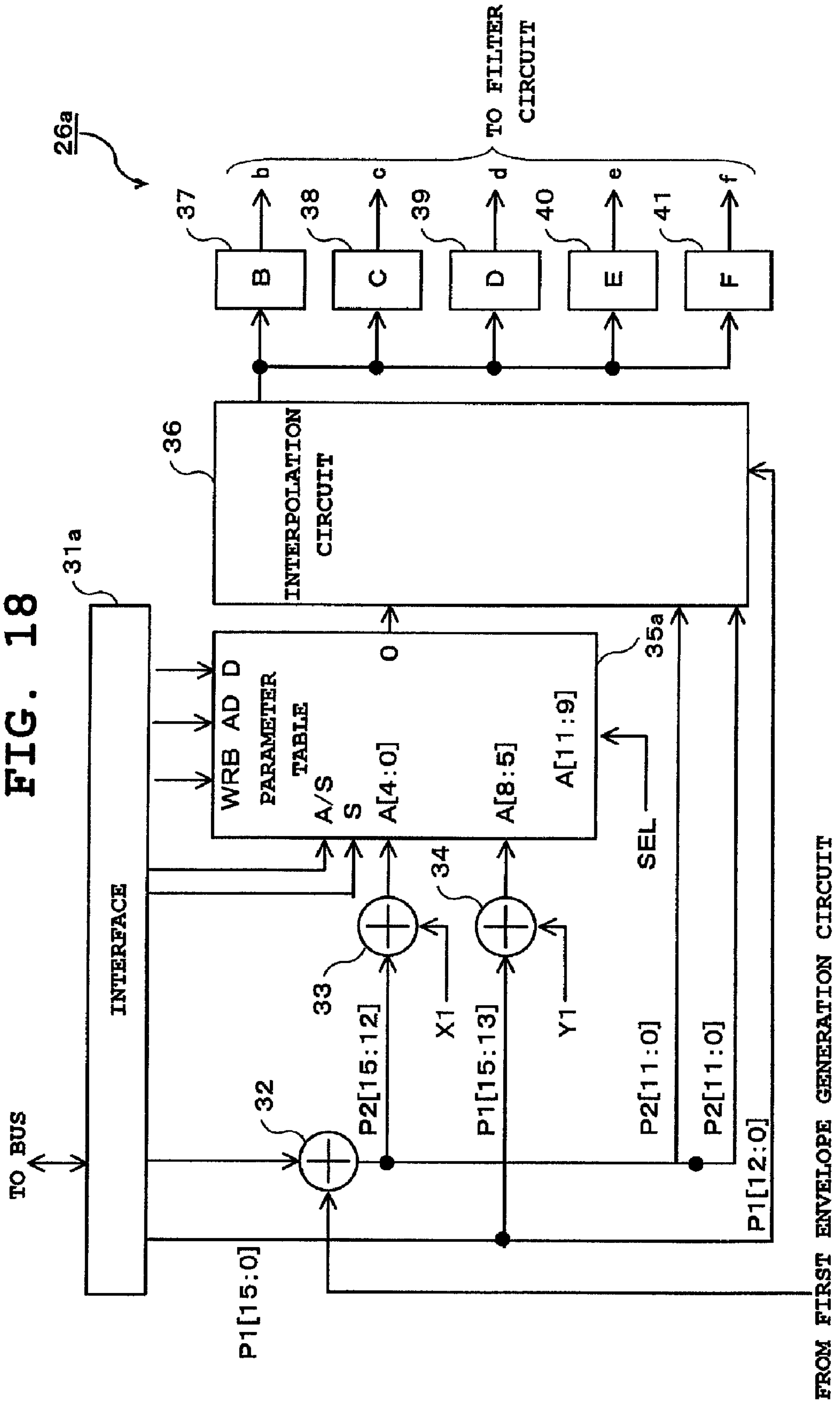
FIG. 18 is a block diagram showing a structure of a filter coefficient calculation circuit according to a second embodiment.

FIG. 18 is a block diagram showing a structure of a filter coefficient calculation circuit according to this embodiment. As shown in FIG. 18, a filter coefficient calculation circuit **26*a* includes an interface 31*a*, the adders 32 to 34, a parameter table 35*a*, the interpolation circuit 36, and the registers 37 to 41. Though not shown in FIG. 18, the filter coefficient calculation circuit 26*a* has a control circuit that outputs increment signals X1 and Y1 of address signals to the parameter table 35*a* and selection signal SEL of the parameter table 35*a*** at a given timing.

The interface **31*a* is connected to the internal bus 28 of the musical sound generation circuit 7. The interface 31*a* receives and retains 2 types of parameters that are transmitted via the interface 20 from the microcomputer 1, and outputs the parameters to the filter calculation circuit 26. In this embodiment, a set of turnover frequency data F [15:0] as the first parameter of the acoustic musical instrument filter characteristics and gain data G [15:0] as the second parameter thereof, and a set of band width data Q [15:0] as the first parameter of the synthesizer filter characteristics and cutoff data fc [15:0] as the second parameter thereof are given from the microcomputer 1** to the interface.

In this embodiment, the interface **31*a* receives filter mode selection signal A/S that selects one of the acoustic musical instrument filter characteristics and synthesizer filter characteristics from the microcomputer 1, and outputs filter mode selection signal A/S to the parameter table 35*a*. In this embodiment, when filter mode selection signal A/S is "0", the filter coefficient calculation circuit 26 operates based on the acoustic musical instrument filter characteristics. Therefore, turnover frequency data F as the first parameter P1 and gain data G as the second parameter P2 are given from the microcomputer 1 to the interface 31***a*.

Meanwhile, when filter mode selection signal A/S is "1", the filter coefficient calculation circuit 26 operates based on the synthesizer filter characteristics. Therefore, bandwidth data Q as the first parameter P1 and cutoff data fc as the second parameter P2 are given from the microcomputer 1 to the interface 31*a*.

Further, in this embodiment, the interface 31*a* receives data for rewriting the parameter table 35*a*, an address, and various control signals from the microcomputer 1, and outputs them to the parameter table 35*a*. In FIG. 18, WRB represents an enable signal for writing the parameter table, and S represents a signal for switching the address. In FIG. 18, D represents data for writing the parameter table 35*a*, and AD represents the address for writing the parameter table 35*a*.

As shown in FIG. 18, the second parameter P2 [15:0] is given to the adder 32. As the other input, the first envelope signal that changes as time goes on is given from the first envelope generation circuit 25 to the adder 32. Therefore, the value of the second parameter P2 [15:0] outputted from the adder changes as time goes on based on the first envelope signal.

Out of the second parameter P2 [15:0], P2 [15:12] is given to the adder 33. Out of the first parameter P1 [15:0], P1 [15:13] is given to the adder 34. In the adders 33 and 34, if necessary, increment signal "1" is added at a given time, and the resultant is outputted as an address of the parameter table 35*a*. In the adder 33, by adding increment signal X1 at the next timing subsequently to outputting P2 [15:12], a continuing address (P2 [15:12]+1) can be outputted. In the adder 34, by adding increment signal Y1 at the next timing subsequently to outputting P1 [15:13], a continuing address (P1 [15:13]+1) can be outputted.

A signal is given from the adder 33 to lower address A [4:0] of the parameter table 35*a*. A signal is given from the adder 34 to upper address A [8:5]. Selection signal SEL is given from the control circuit (not shown) to the uppermost address A [11:9].

Figure 19:
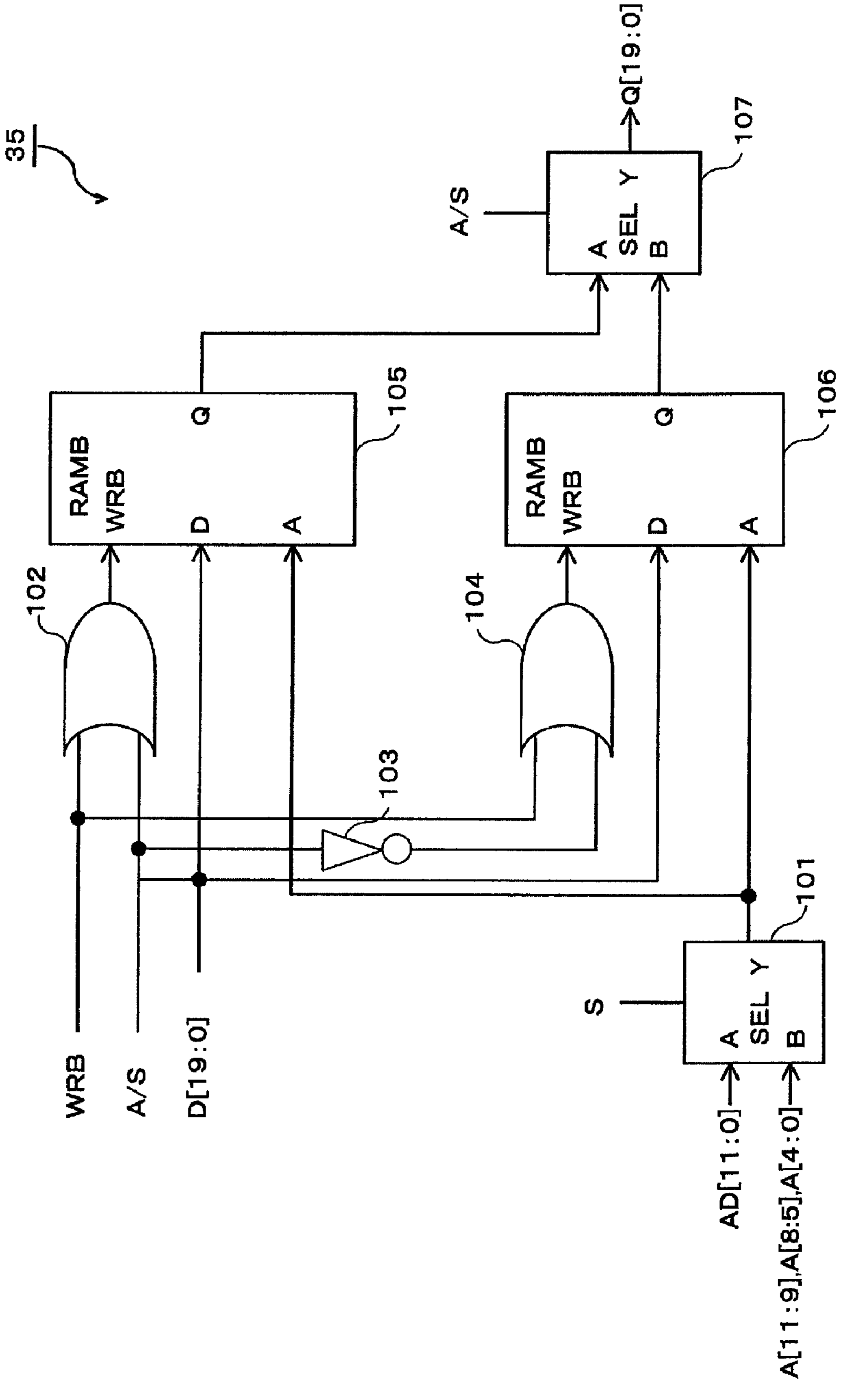
FIG. 19 is a diagram showing an example of a parameter table according to the second embodiment.

FIG. 19 is a diagram showing an example of the parameter table according to this embodiment. As shown in FIG. 19, the parameter table 35*a* has a selector 101, OR circuits 102 and 104, an inverter 103, memories 105 and 106, and a selector 107. In this embodiment, in the memory 105 (RAMA), file coefficients based on the first parameter (turnover frequency data) and the second parameter (gain data) of the acoustic filter characteristics are stored. In the memory 106 (RAMS), filter coefficients based on the first parameter (bandwidth data) and the second parameter (cutoff data) of the synthesizer filter characteristics are stored.

In this embodiment, for example, the memory 105 stores 9 types of turnover frequencies×17 types of gains (8 types of negative gains, gain "0", and 8 types of positive gains)×5 types of filter coefficients. Therefore, the memory 105 stores 9×17×5=765 word filter number.

In the same manner, the memory 106 stores 5 types of filter coefficients for each of 9 types of bandwidth×8 types of cutoff.

For example, for the turnover frequency, to interpolate the upper 3 bit (8 types) values with lower 13 bits, 9 types of addresses are prepared. For the gain, to interpolate the upper 4 bit (16 types) values with lower 12 bits, 17 types of addresses are prepared. Selection signal SEL is used for selecting one of the 5 types of coefficients b to f.

As shown in FIG. 19, WRB signal and A/S signal are given to OR circuit 102. Output of the OR circuit 102 is inputted as write enable of the memory 105. Meanwhile, inversion signals of WRB signal and A/S signal that are inverted by the inverter 103 are given to the OR circuit 104. Output of the OR circuit 104 is inputted as write enable of the memory 106. When "0" is inputted, writing the memory is enabled.

The selector 101 selects writing address AD [11:0] given from the interface 31*a* when S signal is "0", and selects parameter A [11:0] given from the interface 31*a* when S signal is "1".

When data is written in the memories 105 and 106, the microcomputer 1 outputs given control signals (WRB signal, A/S signal, and S signal) to the interface 31*a* and outputs address AD and data D thereto.

By receiving WRB signal "0", A/S signal "0", and S signal "0" from the microcomputer 1 via the interface 31*a*, in the memory 105, writing address AD [11:0] given from the microcomputer 1 via the interface 31*a* is written with data D [19:0] as a filter coefficient based on the acoustic filter characteristics.

By receiving WRB signal "0", A/S signal "1", and S signal "0" from the microcomputer 1 via the interface 31*a*, in the memory 106, writing address AD [11:0] given from the microcomputer 1 via the interface 31*a* is written with data D [19:0] as a filter coefficient based on the synthesizer filter characteristics.

Meanwhile, when WRB signal is "1", the memories 105 and 106 become read memories. The microcomputer 1 outputs a control signal and a parameter to the parameter table 35*a*, so that a filter coefficient is read from the memory 105 in the case that a tone color designated in the switch 4 belongs to tone color of an acoustic musical instrument, or so that a filter coefficient is read from the memory 106 in the case that the tone color designated in the switch belongs to a so-called synthesizer tone color.

When receiving WRB signal "1", A/S signal "0", and S signal "1" from the microcomputer 1 via the interface 31*a*, in the memory 105, data is read under the condition that SEL signal is A [11:9], given upper address of the first parameter P1 [15:13] is A [8:5], and given upper address of the second parameter P2 [15:12] is A [4:0]. Since A/S signal "0" is given to the selector 107 as well, output from the memory 105 is selected. Therefore, from the parameter table 35*a*, a filter coefficient before interpolation based on the turnover frequency and the gain is outputted.

When receiving WRB signal "1", A/S signal "1", and S signal "1" from the microcomputer 1 via the interface 31*a*, in the memory 106, data is read under the condition that SEL signal is A [11:9], given upper address of the first parameter P1 [15:13] is A [8:5], and given upper address of the second parameter P2 [15:12] is A [4:0]. Since A/S signal "1" is given to the selector 107 as well, output from the memory 106 is selected. Therefore, from the parameter table 35*a*, a filter coefficient before interpolation based on the bandwidth and the cutoff is outputted.

The output of the parameter table 35*a*, that is, a set of filter coefficients before interpolation is given to the interpolation circuit 36. In addition, lower data of the turnover frequency data F [12:0] (P1: [12:0]) and lower data of the gain data G [11:0] (P2 [12:0]) are also given to the interpolation circuit 36. In the interpolation circuit 36, 5 types of filter coefficients b to f after interpolation are calculated and outputted. The registers 37 to 41 respectively retain filter coefficients b to f after interpolation sequentially outputted.

According to the second embodiment, the first memory outputting the filter coefficient based on the turnover frequency and the gain and the second memory outputting the filter coefficient based on the bandwidth and the cutoff are provided. According to the designated tone color, the filter coefficient is outputted from one of these memories.

The turnover frequency is based on the frequency of the fundamental wave of a musical sound to be sounded. The gain represents the attenuation degree (or enhancement degree). Therefore, it is possible to realize the digital filter having the filter characteristics significantly approximate to the filter characteristics of an acoustic musical instrument, in particular an acoustic piano by intuitively understandable parameters without performing complicated computing, and thus to output a musical sound with a tone color almost equal to that of the acoustic musical instrument.

Meanwhile, as before, the filter coefficient based on the bandwidth and the cutoff is outputted by using the second memory. Thereby, the digital filter having the existing filter characteristics can be realized, and a musical sound with a tone color peculiar to a synthesizer can be outputted.

C. Modified Example of the Second Embodiment

Next a description will be given of a modified example of the second embodiment.

In this embodiment, 2 memories (RAMA and RAMB) are included. One memory (RAMA) stores a filter coefficient based on the acoustic musical instrument filter characteristics, and outputs the filter coefficient with the use of turnover frequency data and gain data as the address. The other memory (RAMB) stores a filter coefficient based on the synthesizer filter characteristics, and outputs the filter coefficient with the use of bandwidth data and cutoff data as the address.

It is needless to say that 2 memories are not necessarily required physically. The foregoing method may be embodied by segmenting an address space of a single memory into 2 sections. One section stores the filter coefficient based on the acoustic musical instrument filter characteristics as a RAMA. The other section stores the filter coefficient based on the synthesizer filter characteristics as a RAMB.

Meanwhile, in this modified example, with the use of a rewritable single memory, one of the filter coefficients based on the acoustic musical instrument filter characteristics and the filter coefficient based on the synthesizer filter characteristics is stored according to control by the microcomputer 1.

Figure 20:
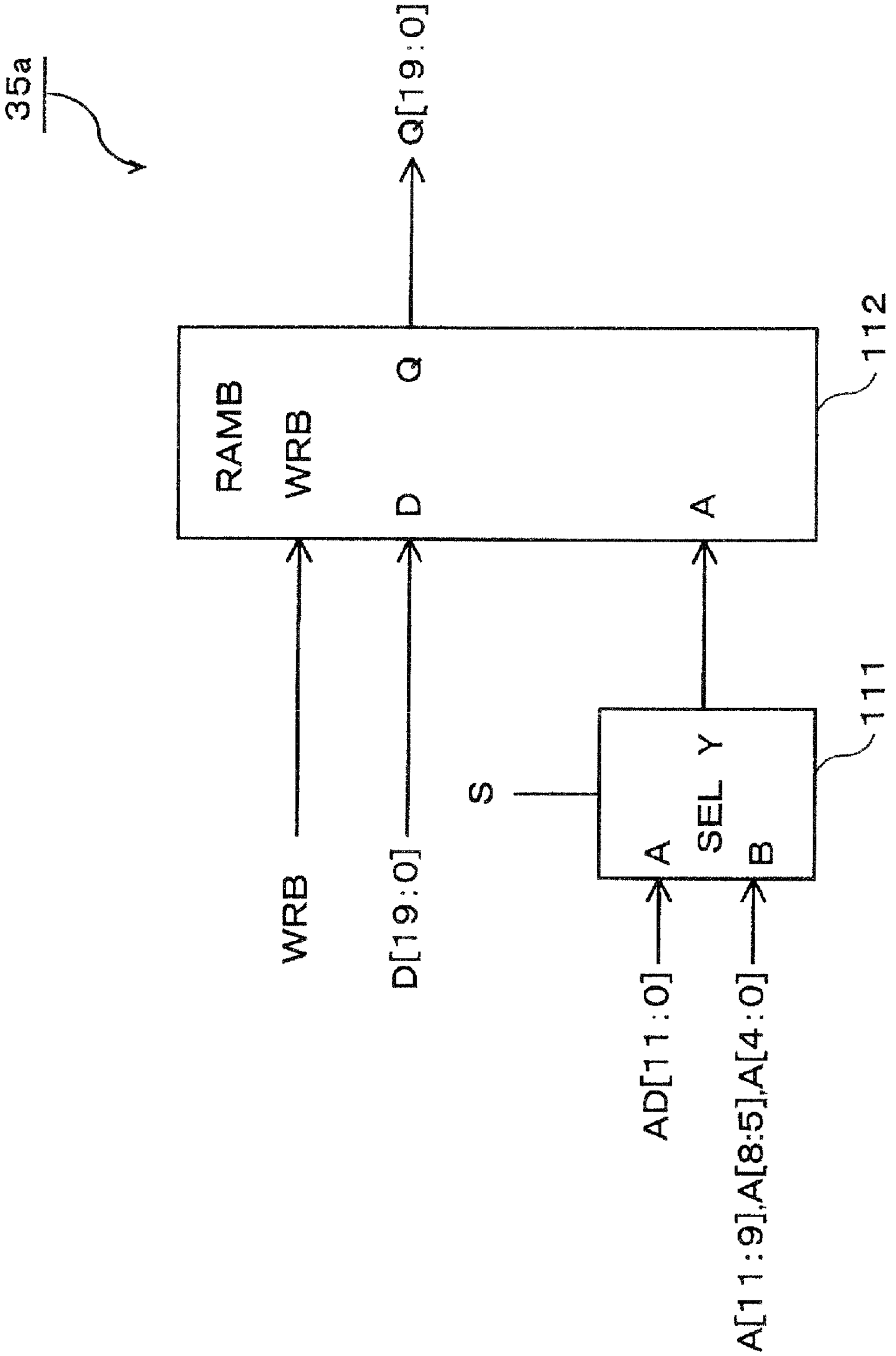
FIG. 20 is a diagram showing an example of a parameter table according to a modified example of the second embodiment.

FIG. 20 is a block diagram showing an example of a parameter table according to the modified example of this embodiment.

As shown in FIG. 20, the parameter table has a selector 111 and a memory 112. As a control signal, WRB signal and S signal are given from the interface 31*a* to the parameter table. Differently from the foregoing embodiment, the memory is not necessarily switched. Therefore, A/S signal is omitted. Except for that, all elements such as an address and data are similar to those of the foregoing embodiment.

When data is written into the memory 112, the microcomputer 1 outputs given control signals (WRB signal and S signal) to the interface 31*a*, and outputs addresses AD and D to the interface 31*a*.

When receiving WRB signal "0" and S signal "0" from the microcomputer 1 via the interface 31*a*, in the memory 112, data D [19:0] corresponding to the filter coefficient is written into writing address AD [11:0] given from the microcomputer 1 via the interface 31*a*.

For example, when the tone color designated in the switch 4 belongs to a tone color of an acoustic musical instrument, a filter coefficient based on the acoustic musical instrument filter characteristics is written into the memory 112 as data D. After that, the memory 112 receives WRB signal "1" and S signal "1" from the microcomputer 1 via the interface 31*a*, and thereby the memory 112 outputs the filter coefficient corresponding to address A [11:0] based on the turnover frequency data and gain data.

When the tone color designated in the switch 4 belongs to a tone color peculiar to a synthesizer, a filter coefficient based on the synthesizer filter characteristics is written into the memory 112 as data D. After that, the memory 112 receives WRB signal "1" and S signal "1" from the microcomputer 1 via the interface 31*a*, and thereby the memory 112 outputs the filter coefficient corresponding to address A [11:0] based on the bandwidth data and cutoff data.

D. Third Embodiment

Next, a description will be given of a third embodiment of the invention.

Currently, many electronic musical instruments employ PCM method. In the PCM method, to decrease the capacity of the waveform memory (waveform ROM), only original waveform data of a plurality of frequencies is retained at given intervals (for example, for every octave) instead of waveform data of each frequency corresponding to the sound pitch of each of all keys is retained. Therefore, when waveform data of a frequency of original waveform data is generated, the original waveform data of the frequency close to the foregoing frequency is read and the pitch is changed.

However, in the PCM method, there is the following problem. That is, when the pitch is changed from the original waveform data, the ratio of a higher harmonic wave in relation to the fundamental wave is changed.

Figure 21A:
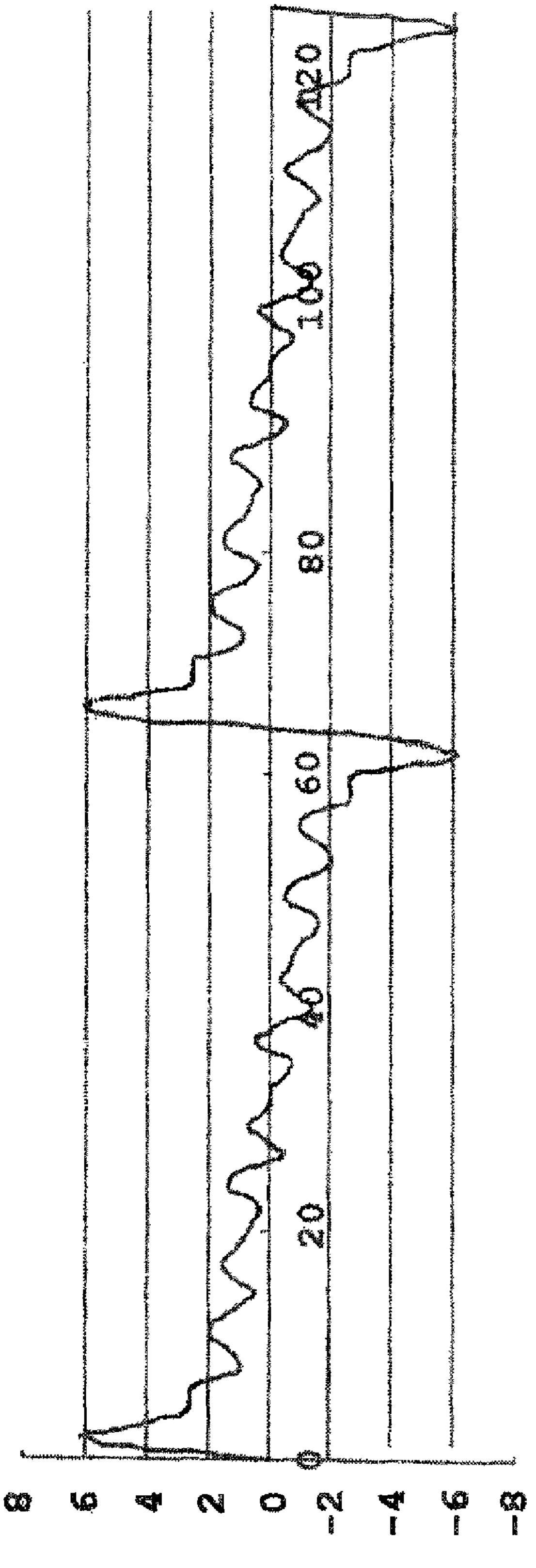
FIGS. 21A and 21B are diagrams showing an example of original waveform data and the spectrum thereof.
Figure 21B:
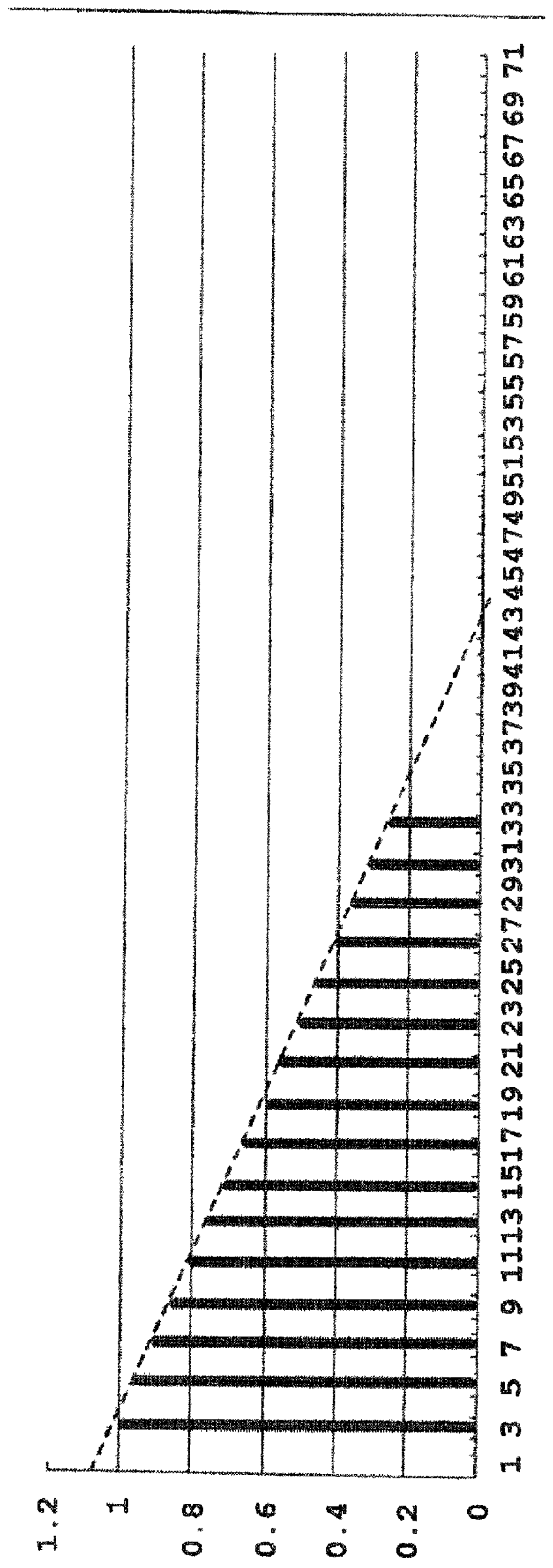
Figure 22A:
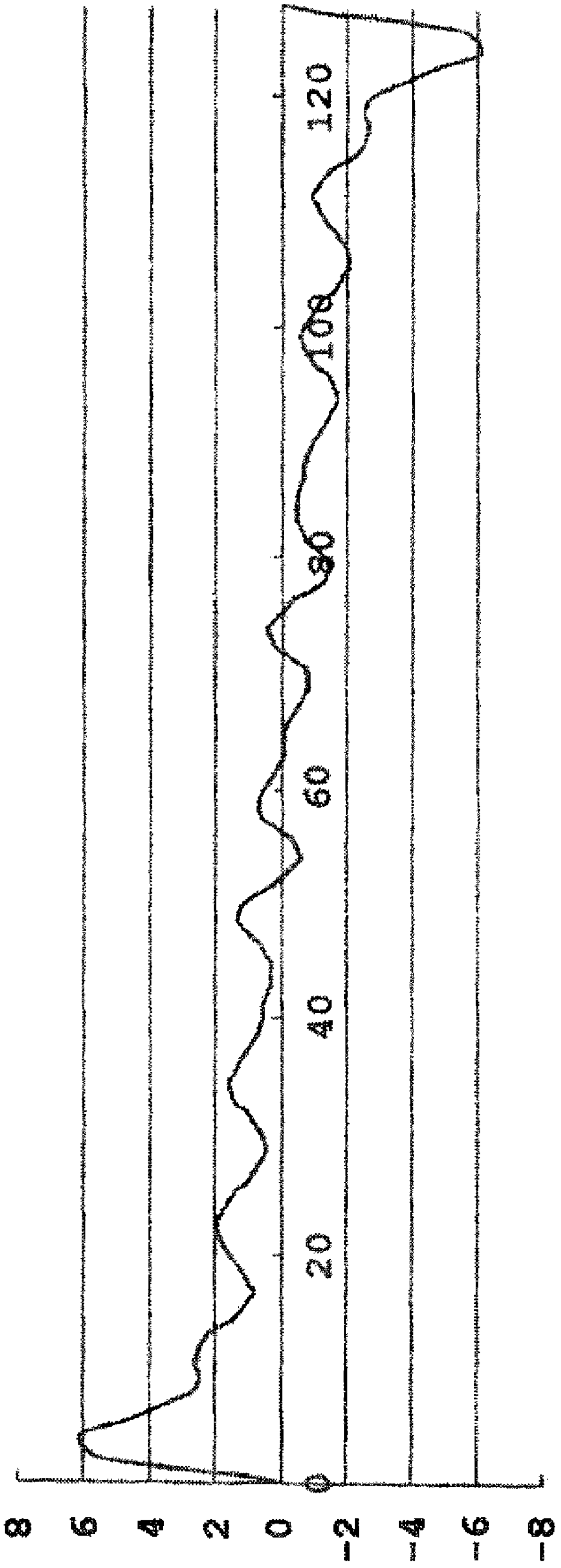
FIGS. 22A and 22B are diagrams showing waveform data when the original waveform data is read where the frequency is one half of an original frequency and the spectrum thereof.
Figure 22B:
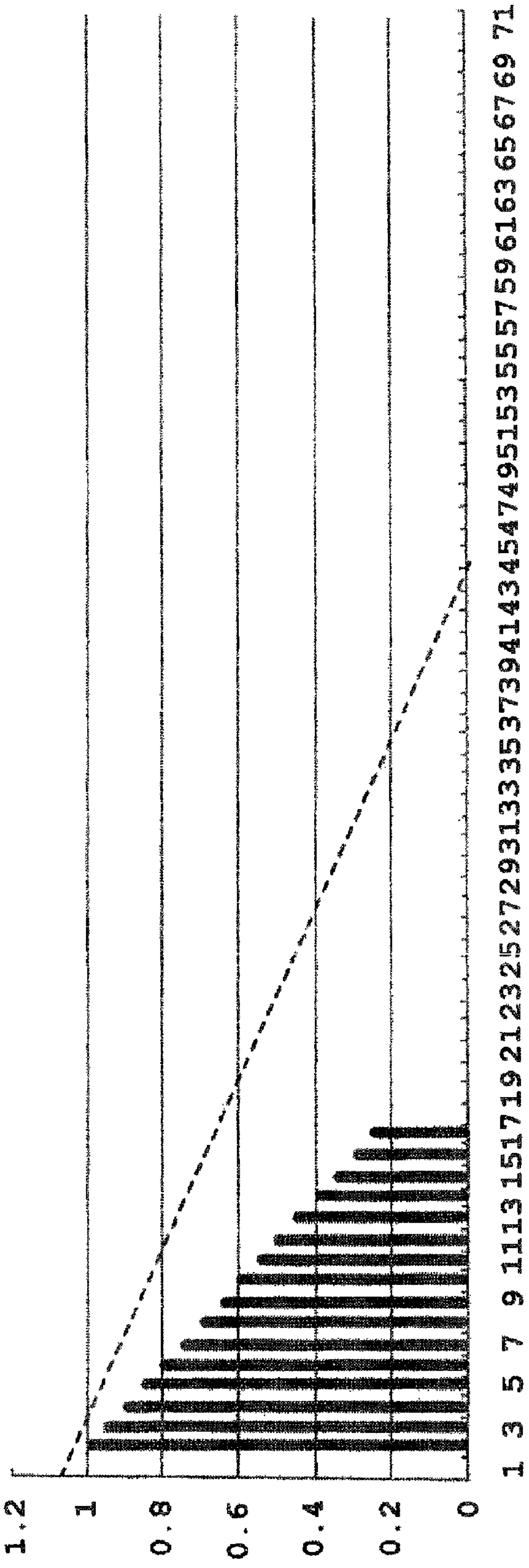

FIG. 21A and FIG. 21B are diagrams showing an example of the original waveform data and the spectrum thereof. FIGS. 22A and 22B are diagrams showing waveform data obtained by reading the original waveform data read in the condition that the frequency is one half of the original frequency and the spectrum thereof. It is evident that the spectrum shown in FIG. 22B is in a state as if the spectrum shown in FIG. 21B is compressed in the lateral direction (direction of the frequency axis), and the ratio of the high order harmonic tone in relation to the fundamental wave is decreased.

Figure 23A:
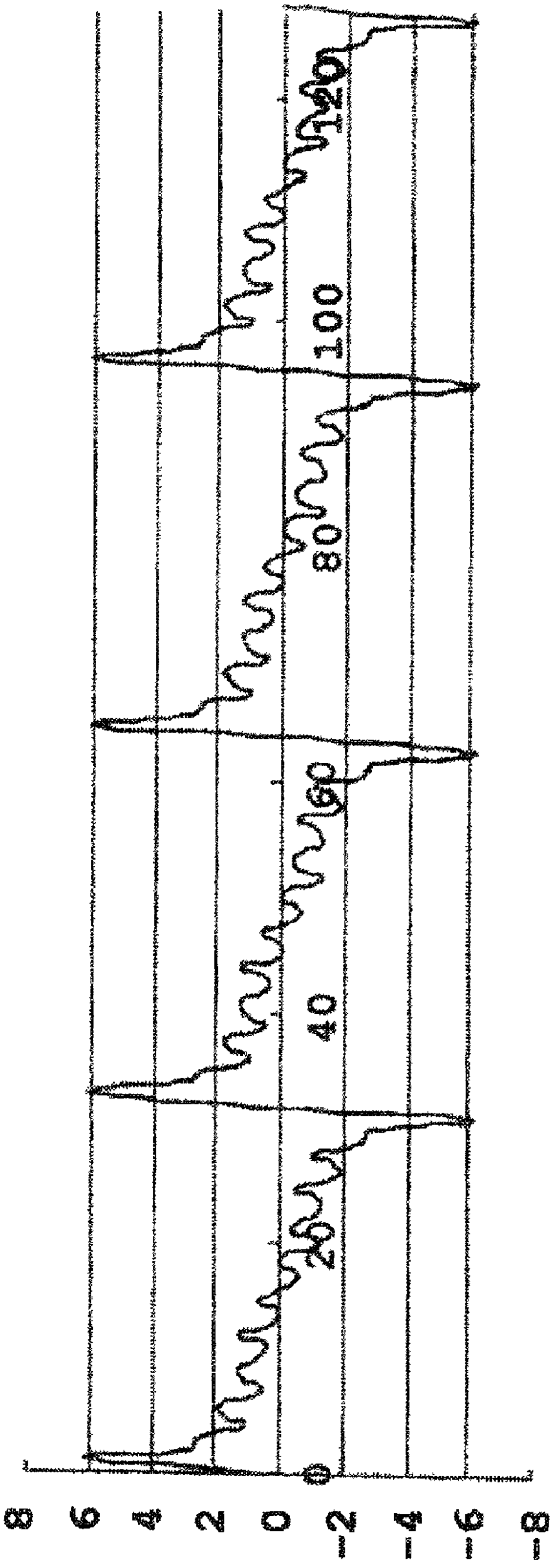
FIGS. 23A and 23B are diagrams showing waveform data when the original waveform data is read where the frequency is twice the original frequency and the spectrum thereof.
Figure 23B:
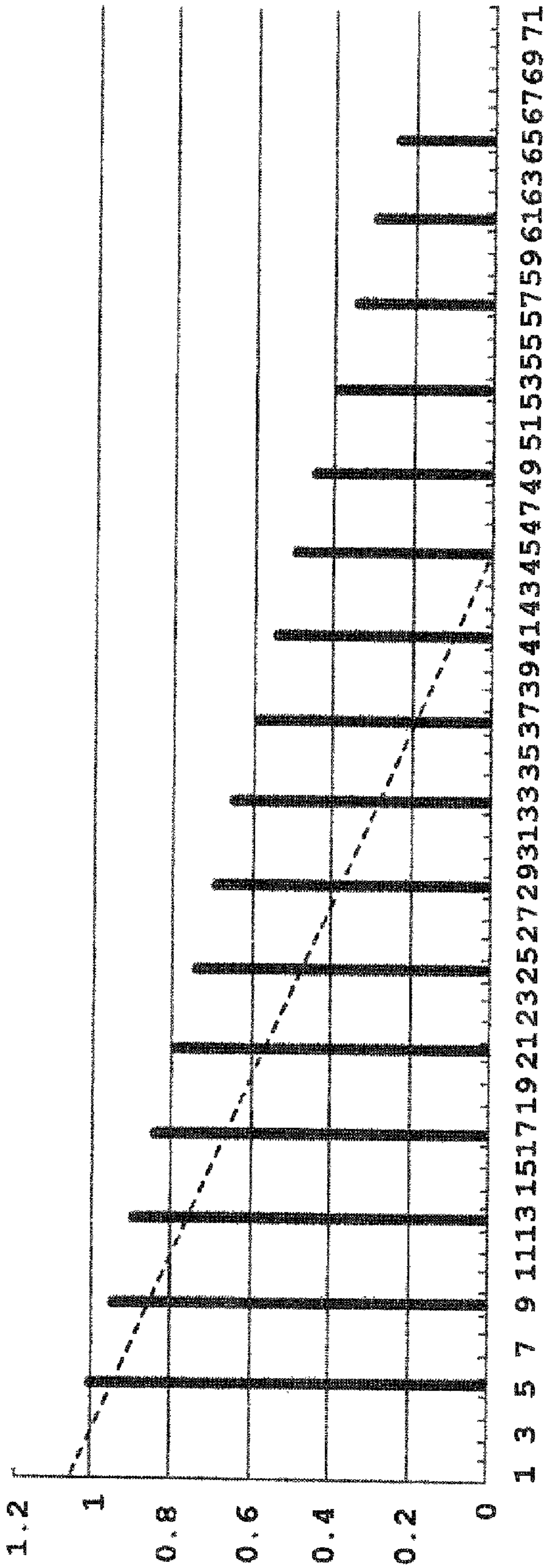

FIG. 23A and FIG. 23B are diagrams showing waveform data obtained by reading the original waveform data in the condition that the frequency is twice the original frequency and the spectrum thereof. It is evident that the spectrum shown in FIG. 23B is in a state as if the spectrum shown in FIG. 21B is elongated in the lateral direction (direction of the frequency axis), and the ratio of the high order harmonic tone in relation to the fundamental wave is increased.

An acoustic musical instrument primitively has a formant depending on the material and the shape of the musical instrument. Such a formant determines the ratio of the high order harmonic tone in relation to the fundamental wave. Therefore, the spectrum change associated with change of the pitch (frequency), in particular the change of the ratio of the high order harmonic tone as described above has the following problem. That is, it results in unnatural tone color change unlikely as an acoustic musical instrument.

According to this embodiment, a filter device capable of realizing tone color change equal to the tone color change of an acoustic musical instrument is provided.

Figure 24:
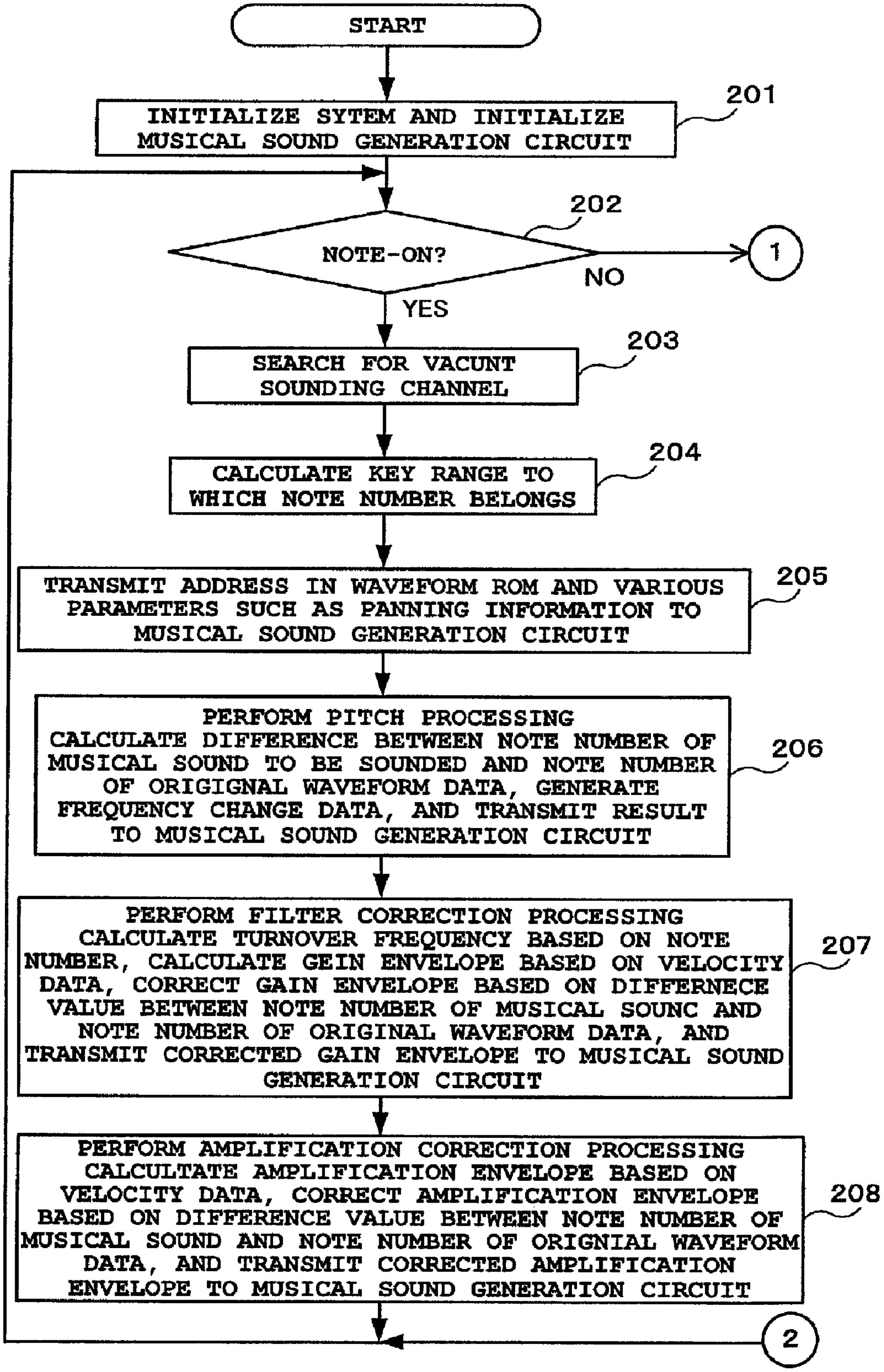
FIG. 24 is a flowchart showing note-on processing in a microcomputer according to a third embodiment.
Figure 25:
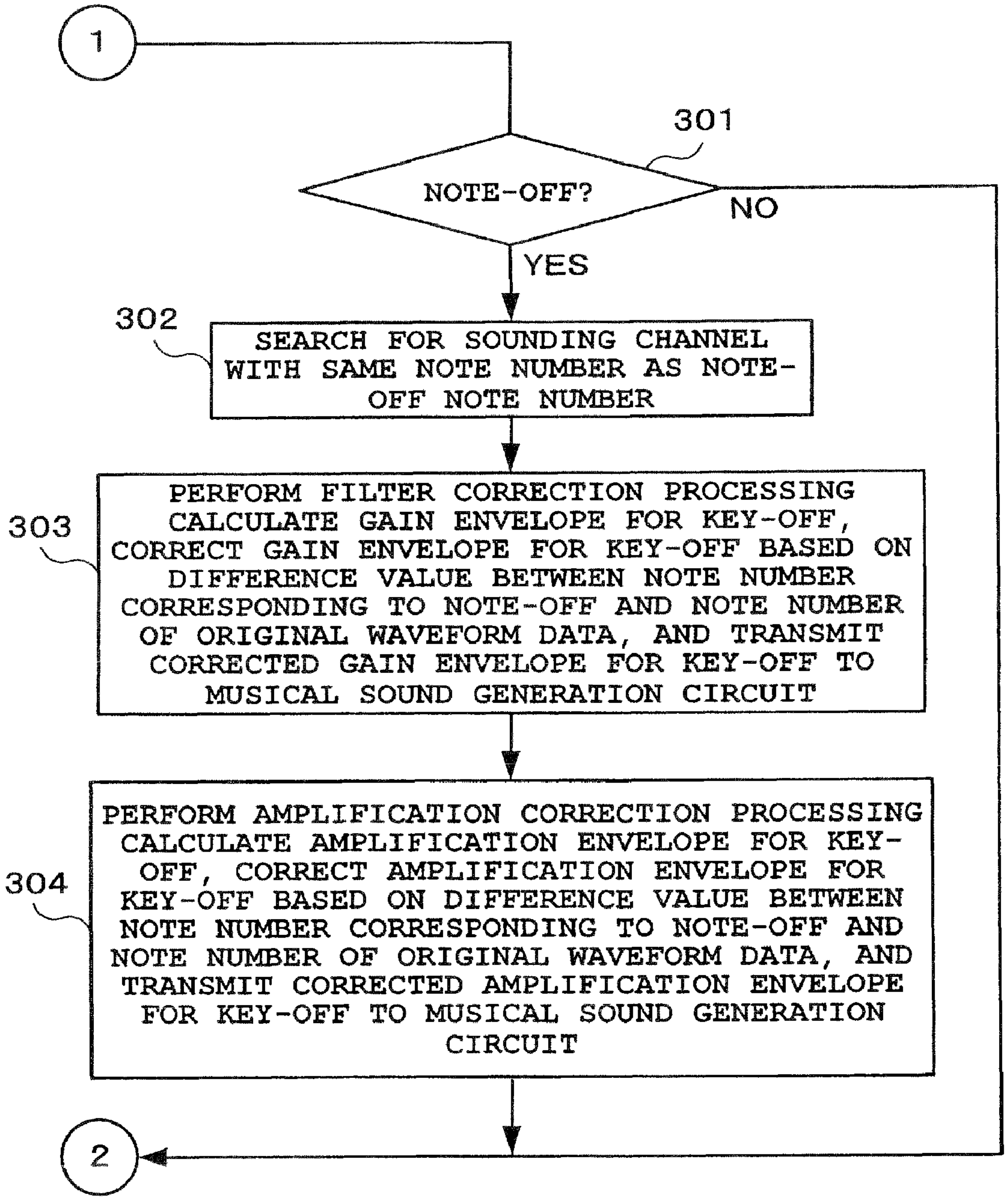
FIG. 25 is a flowchart showing note-off processing in the microcomputer according to this embodiment.

In this embodiment, the microcomputer 1 detects key-on based on performance operation data from the touch detection circuit 5 when the key is touched, executes note-on processing, and controls the musical sound generation circuit 7 to generate a musical sound. The touch detection circuit 5 outputs released-key data including the sound pitch of the released key based on the event that the switch of the key is turned off to the microcomputer 1. When receiving the released-key data, the microcomputer 1 executes note-off processing, and controls the musical sound generation circuit 7 to attenuate the current musical sound. FIG. 24 is a flowchart showing the note-on processing in the microcomputer according to this embodiment. FIG. 25 is a flowchart showing the note-off processing. A description will be given of outlines of the processing. For envelope correction processing, the description will be given later in detail.

As shown in FIG. 24 and FIG. 25, the system (entire electronic musical instrument) and the musical sound generation circuit 7 are initialized (Step 201). After that, the microcomputer 1 monitors note-on and note-off (Step 202 of FIG. 24 and Step 301 of FIG. 25). When detecting note-on (Y in Step 202), the microcomputer 1 detects a soundable vacant channel (Step 203). In this embodiment, "n" pieces of musical sounds can be concurrently sounded. The musical sound generation circuit 7 has time-divided "n" channels, and musical sound waveform data is generated in each channel.

Next, the microcomputer 1 calculates the key range to which the sound pitch corresponding to note-on (note number) belongs (Step 204). In this embodiment, as shown in FIG. 26, in the waveform ROM 8, for each set of multiple keys, original waveform data of a note number approximately in the center of the key range composed of each set of multiple keys is stored. For each note number included in the key range, the pitch of the original waveform data is changed and thereby the waveform data is obtained. For example, keys are divided into N pieces of key ranges. Key range i includes multiple keys F4 to A4, and the waveform data of the sound pitch of G4 is stored in the waveform ROM 8 as the original waveform data of the key range (refer to referential symbol 401).

The microcomputer 1 transmits the address in the waveform ROM 8 of the original waveform data of the key range calculated in Step 204 and various parameters such as panning information indicating weight to the right and left channels in the mixer 24 described later to the musical sound generation circuit 7 (Step 205). Next, the microcomputer 1 executes pitch processing (Step 206). In the pitch processing, the microcomputer 1 calculates the difference between the note number of the musical sound to be sounded and the note number of the original waveform data, and transmits the difference value as frequency change data to the musical sound generation circuit 7.

Further, the microcomputer 1 executes filter correction processing (Step 207). Schematically speaking, in the filter correction processing, the microcomputer 1 calculates the after-mentioned turnover frequency based on the note number of the musical sound to be sounded, and calculates the after-mentioned gain envelope (first envelope) based on the velocity data. Furthermore, the microcomputer 1 corrects the gain envelope based on the difference value between the note number of the musical sound to be sounded and the note number of the original waveform data, and transmits the corrected gain envelope to the musical sound generation circuit 7.

In this embodiment, the microcomputer 1 gives the target value of the gain envelope and the rate corresponding to the speed (slope) of the envelope to the musical sound generation circuit 7. The target value and the rate are repeatedly given as appropriate from the microcomputer 1 to the musical sound generation circuit 7.

Further, the microcomputer 1 executes amplification correction processing (Step 208). Schematically speaking, in the amplification correction processing, the microcomputer 1 calculates, amplification envelope (second envelope) based on the velocity data. Furthermore, the microcomputer 1 corrects the amplification envelope based on the difference value between the note number of the musical sound to be sounded and the note number of the original waveform data, and transmits the corrected amplification envelope to the musical sound generation circuit 7.

In the same manner as in the gain envelope, the microcomputer 1 gives the target value of the amplification envelope and the rate corresponding to the speed (slope) of the envelope to the musical sound generation circuit 7.

When detecting note-off (Y in Step 301), the microcomputer 1 searches for the sounding channel for sounding with the same note number as the note number corresponding to the note-off (Step 302). Next, the microcomputer 1 executes filter processing for key-off (Step 303). In this case, the microcomputer 1 calculates the gain envelope for key-off, corrects the gain envelope for key-off based on the difference value between the note number corresponding to the note-off and the note number of the original waveform data, and transmits the corrected gain envelope for key-off to the musical sound generation circuit 7.

The microcomputer 1 executes amplification correction processing for key-off (Step 304). In the amplification correction processing for key-off, the microcomputer 1 calculates the amplification envelope for key-off, corrects the amplification envelope for key-off based on the difference value between the note number corresponding to note-off and the note number of the original waveform data, and transmits the corrected amplification envelope to the musical sound generation circuit 7.

Figure 27:
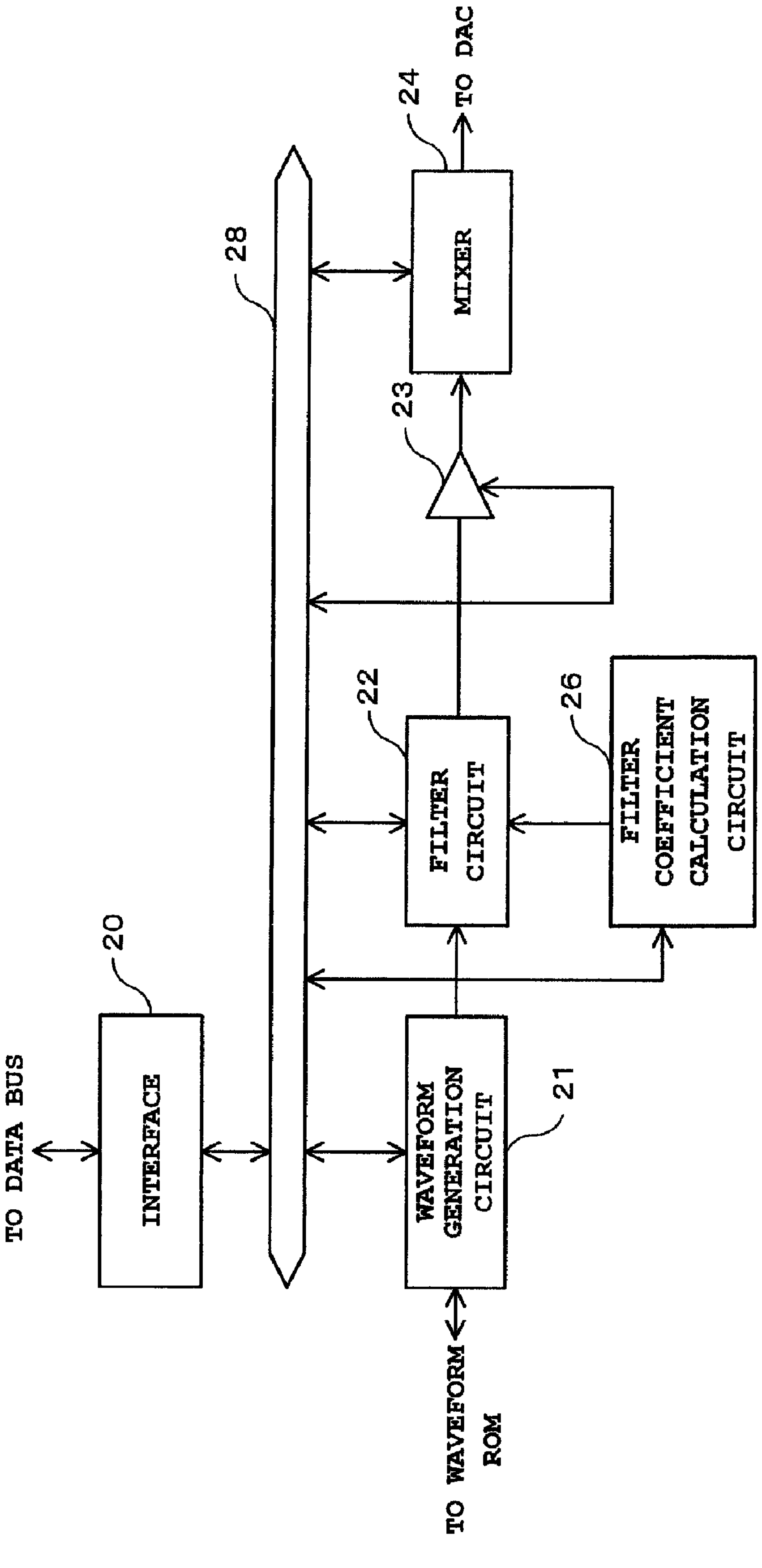
FIG. 27 is a block diagram showing in more detail a musical sound generation circuit according to the third embodiment.

FIG. 27 is a block diagram showing in more detail the musical sound generation circuit according to the third embodiment. As shown in FIG. 27, the musical sound generation circuit 7 has the interface 20, the waveform generation circuit 21, the filter circuit 22, the multiplier circuit 23, the mixer 24, and the filter coefficient calculation circuit 26. The interface 20, the waveform generation circuit 21, the filter circuit 22, the mixer 24, and the filter coefficient calculation circuit 26 are connected to the internal bus 28.

The interface 20 is connected to the data bus 13 shown in FIG. 1. The interface 20 writes setting data and the like into each computing unit such as the waveform generation circuit 21 and the filter circuit 22 in the musical sound generation circuit 7 via the internal bus 28.

The waveform generation circuit 21 is connected to the waveform ROM 8. The waveform generation circuit 21 receives frequency change data generated in the microcomputer 1, reads PCM waveform data (original waveform data) from a given address of the waveform ROM 8, changes the pitch based on the frequency change data, and generates musical sound waveform data of the sound pitch (note number) of the musical sound to be sounded.

The filter coefficient circuit 26 calculates a filter coefficient according to a parameter based on a performance operation signal given from the microcomputer 1 via the interface 20 and the corrected gain envelope (first envelope) changed over time that is given from the microcomputer 1.

Unless the gain envelope reaches the target value, the current gain envelope can be obtained by adding the rate given from the microcomputer 1 to the gain envelope of the previous processing.

The frequency characteristics are changed by the first envelope. Thus, the filter coefficient is changed as time goes on.

The filter circuit 22 provides filter processing for the musical sound waveform data according to the filter coefficient.

The multiplier 23 multiplies the musical sound waveform data by the corrected amplification envelope (second envelope) changed over time that is given from the microcomputer 1.

In the same manner as the gain envelope, unless the amplification envelope reaches the target value, the amplification envelope can be obtained by adding the rate given from the microcomputer 1 to the amplification envelope of the previous processing.

Thereby, rise and decay of the musical sound corresponding to turning on/off the keys of the keyboard 6 and the sound volume corresponding to the touch response data are controlled. The waveform generation circuit 21, the filter circuit 22, the filter coefficient calculation circuit 26, and the multiplier 23 can process the maximum simultaneous sounding number in a manner of time division, and thereby can generate the number of channels (N channel) of musical sounds sufficient for keyboard performance.

The mixer 24 accumulates each of the generated maximum simultaneous sounding number of channels of musical sounds with the use of a given weighting accordingly to the panning information, and finally allocates the result as 2 right and left channel musical sounds. The output from the mixer 24 is outputted to the DAC 9.

Next, a description will be given in more detail of the filter correction processing (Step 207) and the amplification correction processing (Step 208) described with reference to FIG. 24 and FIG. 25. As described above, in this embodiment, the turnover frequency is determined by the sound pitch (note number), and the level is determined by the velocity data. Further, in the filter coefficient calculation circuit 26, the level is added with the corrected gain envelope (first envelope) changed over time.

Where the target value of the corrected gain envelope is GainEnvelopeTarget', the target value of the gain envelope based on the velocity data is GainEnvelopeTarget, and the note number of the original waveform data is Originalkey, and the note number corresponding to note-on is NoteNo, GainEnvelopeTarget' is expressed as follows.

$$\text{GainEnvelopeTarget}'=\text{GainEnvelopeTarget}-G\text{sense}\times(\text{NoteNo}-\text{OriginalKey})$$

where Gsense represents correction sensitivity data, shows the change degree of the envelope, and is set to an appropriate value.

According to the foregoing correction formula, when the note number of the musical sound to be sounded is higher than the note number of the original waveform data, the level of the gain envelope is decreased by correction. That is, the value on and after Gsense is positive, and thus GainEnvelopeTarget is subtracted. Meanwhile, when the note number of the musical sound to be sounded is lower than the note number of the original waveform data, the level of the gain envelope is increased. That is, the value on and after Gsense is negative, and thus GainEnvelopeTarget is added.

As described above, in this embodiment, when the note number of the musical sound to be sounded is higher than the note number of the original waveform, that is, when the spectrum becomes as shown in FIG. 23B due to pitch change without correction, the corrected gain envelope GainEnvelopeTarget' is calculated so that the high order harmonic tone level becomes low. Meanwhile, when the note number of the musical sound to be sounded is lower than the note number of the original waveform, that is, when the spectrum becomes as shown in FIG. 22B due to pitch change without correction, the corrected gain envelope GainEnvelopeTarget' is calculated so that the high order harmonic tone level becomes high.

As the gain envelope changes as time goes on, the corrected gain envelope data is time-series data that changes as time goes on.

In this embodiment, by adjusting the gain envelope, the gain as one of the filter parameters is adjusted to correct a tone color (filter correction processing). Meanwhile, sound volume change associated with pitch change is adjusted by correcting the amplification envelope (amplification correction processing).

Where the target value of the corrected amplification envelope is AmpEnvelopeTarget', the target value of the amplification envelope based on the velocity data is AmpEnvelopeTarget, the note number of the original waveform data is OriginalKey, and the note number corresponding to note-on is NoteNo, AmpEnvelopeTarget' is expressed as follows.

$$\text{AmpEnvelopeTarget}'=\text{AmpEnvelopeTarget}-A\text{sense}\times(\text{NoteNo}-\text{OriginalKey})$$

where Asense represents correction sensitivity data as Gsense does, shows the change degree of the envelope, and is set to an appropriate value.

As described above, again, in correcting the amplification envelope, when the note number of the musical sound to be sounded is higher than the note number of the original waveform data, correction is made so that the amplification envelope level is decreased and the sound volume becomes smaller. Meanwhile, when the note number of the musical sound to be sounded is lower than the note number of the original waveform data, correction is made so that the amplification envelope level is increased and the sound volume becomes larger.

The same is applied to the filter correction processing (Step 303) and amplification correction processing (Step 304) in the case of note-off. In filter correction processing, key-off gain envelope may be used as GainEnvelopeTarget. In amplification processing, key-off amplification envelope may be used as AmpEnvelopeTarget.

According to the third embodiment, the parameter table that outputs the filter coefficients based on the turnover frequency and gain is provided, and the filter circuit is controlled by the filter coefficients using the parameter table. The turnover frequency is based on the frequency of the fundamental wave of the musical sound to be sounded. The gain represents the attenuation degree (or enhancement degree). Therefore, it is possible to realize the digital filter having the filter characteristics significantly approximate to the filter characteristics of an acoustic musical instrument, in particular an acoustic piano by intuitively understandable parameters without performing complicated computing.

Further, according to this embodiment, the high order harmonic tone level in relation to the fundamental wave is adjusted by increasing or decreasing the gain based on the difference between the sound pitch (note number) of the musical sound to be sounded and the sound pitch (note number) of the original waveform data read from the waveform ROM. According to this embodiment, the formant is corrected when the pitch of the original waveform data is changed, and thus the formant can be consistent even when the pitch is changed.

In the third embodiment, to calculate the corrected gain envelope, the difference value between the note number of the musical sound to be sounded and the note number of the original waveform data is added to (or is subtracted from) the original gain envelope. However, the calculation is not limited to such computing. It is possible that the ratio between the note number of the musical sound to be sounded and the note number of the original waveform data or the ratio based on the difference value is calculated; and the gain envelope is changed (for example, by multiplication) based on the ratio. The same can be applied to correcting the amplification envelope.

Further, in the embodiment, the target value and the rate of the gain envelope (first envelope) and the target value and the rate of the amplification envelope (second envelope) are given from the microcomputer to the musical sound generation circuit. Therefore, in the musical sound generation circuit 7, each envelope is interpolated according to the rate until the envelope reaches the target value. However, the method is not limited thereto.

E. Fourth Embodiment

Figure 28:
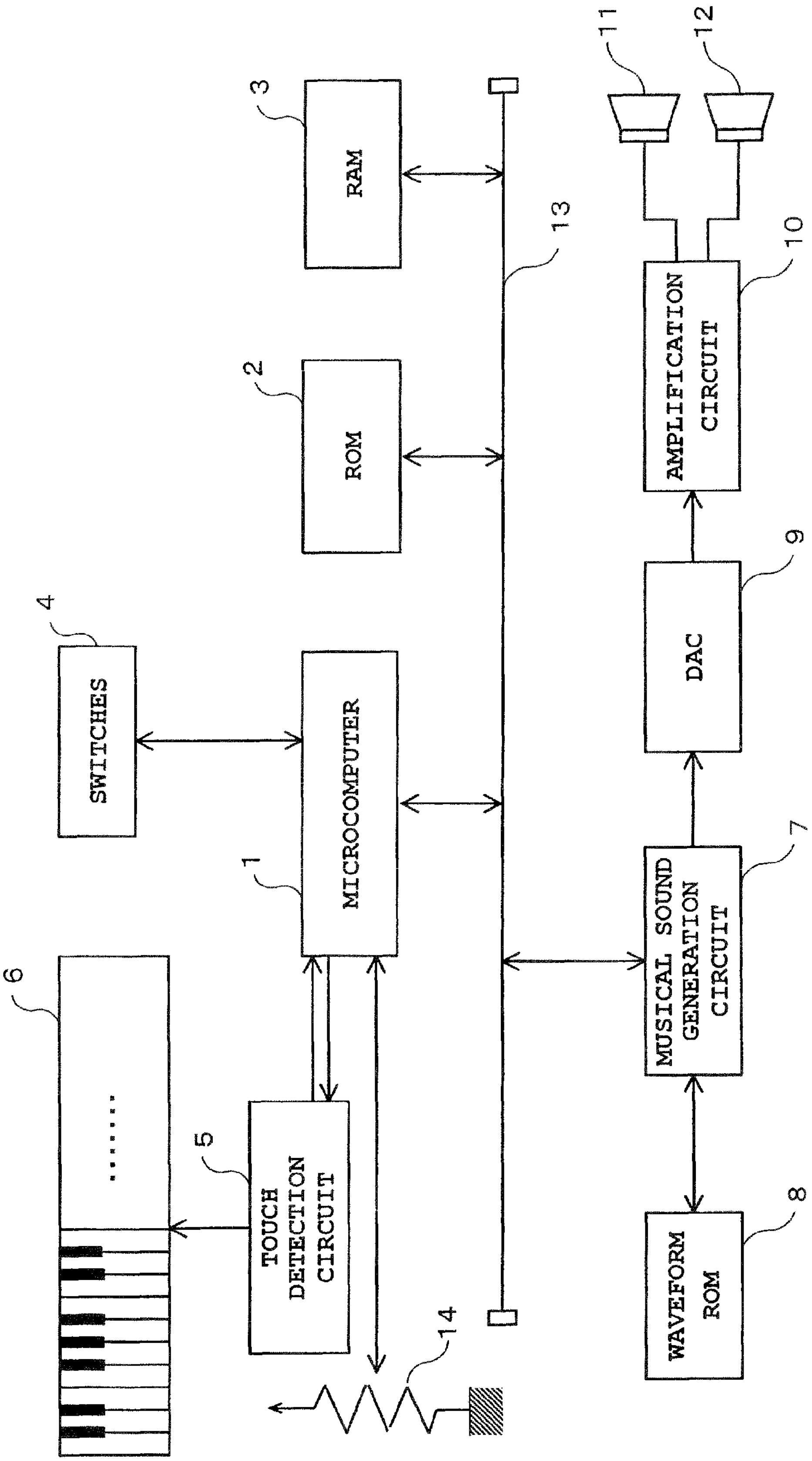
FIG. 28 is a block diagram showing an outline of an electronic musical instrument according to a fourth embodiment of the present invention.

Next, a description will be given of a fourth embodiment of the present invention. As shown in FIG. 28, the electronic musical instrument according to the forth embodiment includes a bender volume 14 in addition to the elements of the third embodiment. The bender volume 14 is connected to the input terminal of the A/D converter (not shown) included in the microcomputer 1. The volume value thereof is converted to a digital value by the A/D converter. The microcomputer 1 executes processing for changing the pitch of the current musical sound based on the digitalized volume value. Such processing for changing the pitch of the current musical sound based on the volume value (hereinafter referred to as "bender processing) is executed at an interval so that discontinuity due to changing the pitch is not sensed.

Figure 29:
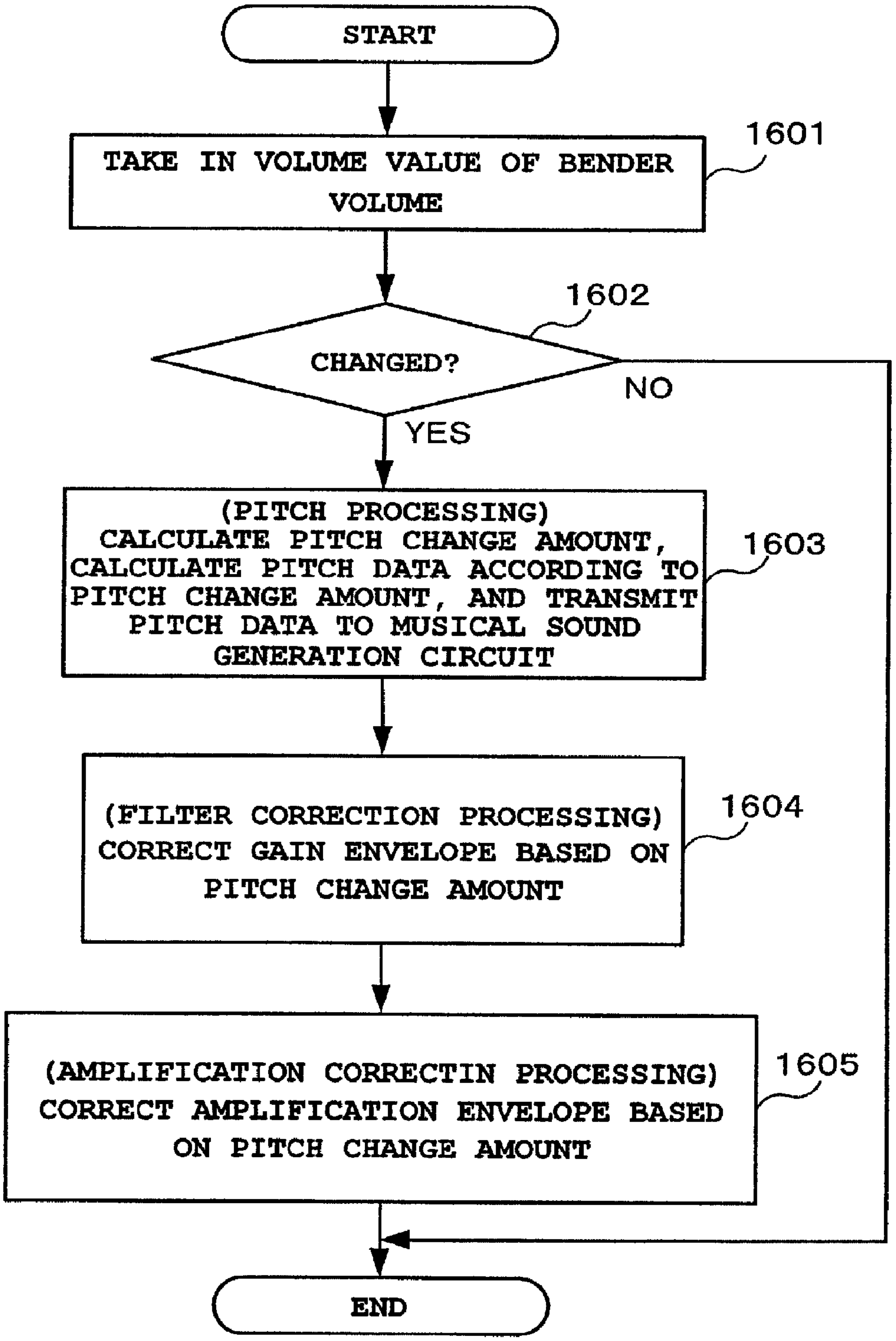
FIG. 29 is a flowchart showing a bender processing in a microcomputer according to the forth embodiment.

FIG. 29 is a flowchart showing the bender processing according to the forth embodiment. The bender processing is interrupting processing executed at a given interval as described above. As shown in FIG. 29, the microcomputer 1 takes in the volume value of the bender volume (Step 1601), compares the volume value to the value in the previous processing, and determines whether or not the value has been changed (Step 1602). When the value has been changed (Y in Step 1602), the pitch change amount is calculated based on the volume value and bend range data, generates pitch data according to the calculated pitch change amount, and transmits the pitch data to the musical sound generation circuit 7 (Step 1603). The bend range data represents the pitch change range when the bender is moved at the maximum, and stored in the RAM 3.

Next, the microcomputer 1 corrects the gain envelope (first envelope) based on the previously calculated pitch change amount, and transmits the corrected gain envelope with the rate to the musical sound generation circuit 7 (Step 1604).

Where the target value of the corrected gain envelope is GainEnvelopeTarget', the target value of the gain envelope based on the velocity data is GainEnvelopeTarget, and the pitch change amount is PitchChange, GainEnvelopeTarget' is expressed as follows.

$$GainEnvelopeTarget' = GainEnvelopeTarget - Gsense \times PitchChange$$

where Gsense represents correction sensitivity data, shows the change degree of the envelope, and is set to an appropriate value according to the pitch change amount. The pitch change amount is the difference value obtained by subtracting the frequency of the current musical sound from a new frequency after pitch change (new pitch data frequency). The pitch change amount becomes positive when the new frequency is higher than the frequency of the current musical sound. Therefore, in this case, the corrected gain envelope becomes lower than the original envelope. Meanwhile, the pitch change amount becomes negative when the new frequency is lower than the frequency of the current musical sound. Therefore, in this case, the corrected gain envelope becomes higher than the original envelope.

The microcomputer 1 corrects the amplification envelope (second envelope) based on the pitch change amount, and transmits the corrected amplification envelope with the rate to the musical sound generation circuit 7 (Step 1605).

Where the target value of the corrected amplification envelope is AmpEnvelopeTarget', the target value of the amplification envelope based on the velocity data is AmpEnvelopeTarget, and the pitch change amount is PitchChange, AmpEnvelopeTarget' is expressed as follows.

$$AmpEnvelopeTarget' = AmpEnvelopeTarget - Asense \times PitchChange$$

where Asense represents correction sensitivity data as Gsense does, shows the change degree of the envelope, and is set to an appropriate value according to the pitch change amount.

As described above, when the pitch of the current musical sound is changed associated with operating the bender volume, the gain envelope and the amplification envelope are corrected based on the pitch change amount. Therefore, even when the pitch of the current musical sound is changed, the formant can be consistent, and the tone color or the like can be prevented from being changed unnaturally.

While the present invention has been described with reference to the preferred embodiments, it is intended that the invention be not limited by any of the details of the description therein but includes all the embodiments which fall within the scope of the appended claims.

What is claimed is:

1. An electronic musical instrument comprising:

sound instructing means for instructing a frequency and a strength of a musical sound to be sounded by external operation;

musical sound generating means for generating a musical sound signal based on the frequency instructed by the sound instructing means;

controlling means for calculating a first parameter based on the frequency of the musical sound to be sounded and a second parameter based on the strength of the musical sound to be sounded;

a parameter table having a first memory storing a plurality of sets of filter coefficients that are associated with each of a plurality of frequencies and a plurality of levels representing a degree of attenuation or enhancement of a gain of a filter in filter characteristics;

filter coefficient generating means for extracting a set of filter coefficients determined based on the first parameter and the second parameter generated by the controlling means; and filter means for providing filtering processing based on the filter characteristics determined by the set of filter coefficients extracted by the filter coefficient generating means for the musical sound signal generated by the musical sound generating means, and for outputting a filtered result;

wherein the parameter table stores a set of filter coefficients based on each set which includes each first parameter and a plurality of second parameters with a maximum level different from each other for each of a plurality of first parameters in order to obtain the filter characteristics in which the attenuation or the enhancement is realized with an almost constant slope from a reference frequency which is determined by the frequency of the supplied musical sound signal, which rises or falls as the frequency rises and falls, and from which the attenuation or the enhancement of the filter is started, and in which the slope is increased as the strength of the supplied musical sound signal is increased, where the second parameter is a maximum level of the attenuation or the enhancement of the gain in relation to the reference frequency in a previously determined given frequency, and the first parameter is a turnover frequency as a frequency in which a level of the gain becomes a given ratio in relation to the maximum level.

2. The electronic musical instrument according to claim 1, wherein the filter coefficient generating means comprises envelope generating means for changing the second parameter as time goes on.

3. The electronic musical instrument according to claim 2, wherein the envelope generating means adds or subtracts a value changing as time goes on to or from the second parameter.

4. The electronic musical instrument according to claim 1, wherein:

the parameter table outputs the set of filter coefficients based on input which includes a first upper bit of the first parameter and a second upper bit of the second parameter, and the filter coefficient generating means comprises interpolating means for interpolating the filter coefficient outputted from the parameter table using a given first lower bit other than the first upper bit of the first parameter and a given second lower bit other than the second upper bit of the second parameter for each filter coefficient included in the set of filter coefficients.

5. The electronic musical instrument according to claim 1, wherein the parameter table further comprises:

a second memory for storing a plurality of sets of filter coefficients in the filter means that are associated with a first parameter corresponding to each of a plurality of bandwidths and a second parameter corresponding to a cutoff frequency in the filter characteristics; and switching means for selecting between the first memory and the second memory based on a tone color of a musical sound to be sounded, wherein a relevant set of filter coefficients is extracted from one of the first memory and the second memory of the parameter table using the first parameter and the second parameter determined according to the frequency and the strength of the supplied musical sound signal, and the extracted relevant set of filter coefficients is outputted to the filter means.

6. The electronic musical instrument according to claim 5, wherein the parameter table comprises data rewriting means for rewriting data of at least one of the first memory and the second memory.

7. The electronic musical instrument according to claim 1, further comprising:

parameter generating means for correcting the second parameter determined according to the frequency and the strength of the musical sound to be sounded in the controlling means based on a difference between the frequency of the current musical sound and a new frequency corresponding to pitch change instruction.

8. An electronic musical instrument comprising:

sound instructing means for instructing a frequency and a strength of a musical sound to be sounded by external operation;

musical sound generating means for generating a musical sound signal based on the frequency instructed by the sound instructing means;

controlling means for calculating a first parameter based on the frequency of the musical sound to be sounded and a second parameter based on the strength of the musical sound to be sounded;

a parameter table having a first memory storing a plurality of sets of filter coefficients that are associated with each of a plurality of frequencies and a plurality of levels representing a degree of attenuation or enhancement of a gain of a filter in filter characteristics;

filter coefficient generating means for extracting a set of filter coefficients determined based on the first parameter and the second parameter generated by the controlling means; and filter means for providing filtering processing based on the filter characteristics determined by the set of filter coefficients extracted by the filter coefficient generating means for the musical sound signal generated by the musical sound generating means, and for outputting a filtered result;

wherein the parameter table outputs the set of filter coefficients based on input which includes a first upper bit of the first parameter and a second upper bit of the second parameter;

wherein the filter coefficient generating means comprises interpolating means for interpolating the filter coefficient outputted from the parameter table using a given first lower bit other than the first upper bit of the first parameter and a given second lower bit other than the second upper bit of the second parameter for each filter coefficient included in the set of filter coefficients;

wherein the interpolating means calculates:

a first interpolation value obtained by a filter coefficient obtained by changing the first upper bit, a difference value thereof, and the second lower bit;

a second interpolation value obtained by a filter coefficient obtained by changing the first upper bit after changing the second upper bit, a difference value thereof, and the second lower bit; and a third interpolation value obtained by a difference value between the first interpolation value and the second interpolation value and the first lower bit, and wherein the interpolating means outputs the third interpolation value as an interpolated filter coefficient.

9. An electronic musical instrument comprising:

sound instructing means for instructing a frequency and a strength of a musical sound to be sounded by external operation;

musical sound generating means for generating a musical sound signal based on the frequency instructed by the sound instructing means;

controlling means for calculating a first parameter based on the frequency of the musical sound to be sounded and a second parameter based on the strength of the musical sound to be sounded;

a parameter table having a first memory storing a plurality of sets of filter coefficients that are associated with each of a plurality of frequencies and a plurality of levels representing a degree of attenuation or enhancement of a gain of a filter in filter characteristics;

filter coefficient generating means for extracting a set of filter coefficients determined based on the first parameter and the second parameter generated by the controlling means;

filter means for providing filtering processing based on the filter characteristics determined by the set of filter coefficients extracted by the filter coefficient generating means for the musical sound signal generated by the musical sound generating means, and for outputting a filtered result;

storing means for storing original musical sound waveform data of a given frequency for generating musical sound waveform data to be provided with filter processing in the filter means; and parameter generating means for correcting the second parameter determined according to the frequency and the strength of the musical sound to be sounded in the controlling means based on a difference between the frequency of the musical sound to be sounded, frequency of the musical sound and the frequency of the original musical sound waveform data.

10. The electronic musical instrument according to claim 9, wherein the parameter generating means decreases the second parameter when the frequency of the musical sound to be sounded is higher than the frequency of the original musical sound waveform data, and increases the second parameter when the frequency of the musical sound to be sounded is lower than the frequency of the original musical sound waveform data.

11. The electronic musical instrument according to claim 9, wherein the parameter generating means calculates a difference value between the frequency of the musical sound to be sounded and the frequency of the original musical sound waveform data, and corrects the second parameter based on the difference value.

12. The electronic musical instrument according to claim 9, wherein:

the waveform storing means stores the original musical sound waveform data with a different frequency for each frequency bandwidth, and the parameter generating means determines a frequency in storing the original musical sound waveform data based on a frequency bandwidth to which the frequency of the musical sound to be sounded belongs.

13. The electronic musical instrument according to claim 9, wherein the parameter generating means corrects an amplification envelope for controlling a strength of the musical sound waveform data based on the difference between the frequency of the musical sound to be sounded and the frequency of the original musical sound waveform data.

14. An electronic musical instrument comprising:

sound instructing means for instructing a frequency and a strength of a musical sound to be sounded by external operation;

musical sound generating means for generating a musical sound signal based on the frequency instructed by the sound instructing means;

controlling means for calculating a first parameter based on the frequency of the musical sound to be sounded and a second parameter based on the strength of the musical sound to be sounded;

a parameter table having a first memory storing a plurality of sets of filter coefficients that are associated with each of a plurality of frequencies and a plurality of levels representing a degree of attenuation or enhancement of a gain of a filter in filter characteristics;

filter coefficient generating means for extracting a set of filter coefficients determined based on the first parameter and the second parameter generated by the controlling means;

filter means for providing filtering processing based on the filter characteristics determined by the set of filter coefficients extracted by the filter coefficient generating means for the musical sound signal generated by the musical sound generating means, and for outputting a filtered result; and parameter generating means for correcting the second parameter determined according to the frequency and the strength of the musical sound to be sounded in the controlling means based on a difference between the frequency of the current musical sound and a new frequency corresponding to pitch change instruction;

wherein the parameter generating means decreases the second parameter when the new frequency is higher than the frequency of the current musical sound, and increases the second parameter when the new frequency is lower than the frequency of the current musical sound.

15. The electronic musical instrument according to claim 14, wherein the parameter generating means calculates a difference value between the new frequency and the frequency of the current musical sound, and corrects the second parameter based on the difference value.

16. The electronic musical instrument according to claim 14, wherein the parameter generating means corrects an amplification envelope for controlling the strength of the musical sound waveform data based on the difference between the frequency of the current musical sound and the new frequency.

* * * * *